US009306519B1

(12) United States Patent
Cloud

(10) Patent No.: US 9,306,519 B1
(45) Date of Patent: Apr. 5, 2016

(54) PHANTOM-POWERED INLINE PREAMPLIFIER WITH VARIABLE IMPEDANCE LOADING AND ADJUSTABLE INTERFACE

(71) Applicant: Rodger Cloud, Tucson, AZ (US)

(72) Inventor: Rodger Cloud, Tucson, AZ (US)

( * ) Notice: Subject to any disclaimer, the term of this patent is extended or adjusted under 35 U.S.C. 154(b) by 446 days.

(21) Appl. No.: 13/655,840

(22) Filed: Oct. 19, 2012

Related U.S. Application Data

(60) Provisional application No. 61/549,048, filed on Oct. 19, 2011.

(51) Int. Cl.
*H03F 99/00* (2009.01)
*H03F 3/68* (2006.01)

(52) U.S. Cl.
CPC ........................................ *H03F 3/68* (2013.01)

(58) Field of Classification Search
CPC ....... H03G 3/00; H03F 99/00; H03F 2200/03; H04R 3/00
USPC .......................... 381/104, 109, 120, 111, 113
See application file for complete search history.

(56) References Cited

U.S. PATENT DOCUMENTS

| 5,285,500 | A | * | 2/1994 | Mantz | 381/86 |
| 5,285,502 | A | * | 2/1994 | Walton et al. | 381/94.2 |
| 8,081,777 | B2 | * | 12/2011 | North | 381/109 |
| 2005/0220314 | A1 | * | 10/2005 | Lang | H04R 3/00 381/113 |
| 2008/0112579 | A1 | * | 5/2008 | Ming | G06F 3/0362 381/109 |
| 2011/0135118 | A1 | * | 6/2011 | Osborne | 381/122 |
| 2011/0182442 | A1 | * | 7/2011 | McDonald et al. | 381/109 |
| 2011/0286612 | A1 | * | 11/2011 | Cooper | H04H 60/04 381/123 |
| 2013/0070940 | A1 | * | 3/2013 | Khenkin et al. | 381/111 |

* cited by examiner

*Primary Examiner* — Disler Paul
(74) *Attorney, Agent, or Firm* — Invent Capture, LLC.; Samuel S. Cho

(57) ABSTRACT

Phantom-powered inline preamplifiers capable of variable impedance loading are disclosed with unique adjustable interfaces. By enabling a user to adjust impedance loading from an actively-powered audio preamplifier which takes a microphone electrical signal or another sound source signal as an input, this unique audio preamplifier design with various adjustable impedance loading interface configurations can change sound characteristics according to the user's preference in a recording, production, or live concert environment. In addition, a high pass filter incorporated in a preamplifier with the variable impedance loading feature allows the user to further customize sound characteristics in the recording environment. This novel inline preamplifier, which may be standalone or integrated into a microphone casing, is powered via a microphone cable from a component (e.g. another preamplifier) providing the phantom power. This inline preamplifier may be connected to a conventional microphone and receive phantom-power into the inline preamplifier from a conventional preamplifier.

20 Claims, 21 Drawing Sheets

100

300

400

500

700A

700B

700C

700D

800A

800B

800C

800D

1200

1400A    1400B 1700A          1700B

Preamp Circuit with C1

1800

Preamp Circuit without C1

1900

Preamp Circuit without high-pass filter

2000

Preamp Circuit with XFMR and high-pass filter

PHANTOM-POWERED INLINE PREAMPLIFIER WITH VARIABLE IMPEDANCE LOADING AND ADJUSTABLE INTERFACE

BACKGROUND OF THE INVENTION

Audio preamplifiers are important components in sound recording, reproduction, or audio for live concerts or events. In general, an audio preamplifier takes an electrical signal generated from a microphone or another sound source as an input, and further processes and amplifies this input signal to generate a desirable level of amplified electrical signal to other components such as main amplifiers, speakers, or recording equipment.

Preamplifiers take an important role in determining amplified and/or reproduced sound characteristics of the sound source, because it is generally the first actively-powered stage for the electrical signal generated from the microphone or another sound source, which are highly vulnerable to undesirable distortions or noise introduced during any amplification stages. For example, an undesirable introduction of distortions or noise at or before the preamplifier stage may be magnified by subsequent amplification stages, thereby making post-preamplifier stage correction difficult and exacerbating any problems from the preamplifier to recording equipment or a listener.

In audio industry, impedance matching or bridging between a microphone and a preamplifier has been an important requirement for high fidelity electrical signal transmission between an output from the microphone and an input to the preamplifier. In general, the output from the microphone is an electrical signal which typically undergoes signal transformation through a transformer unit inside the microphone circuitry. It is desirable to have the impedance of this output terminal from the microphone match or appropriately bridge the impedance of the preamplifier for high fidelity electrical signal transmission between the microphone and the preamplifier. For example, the resistive impedance matching may involve keeping the impedance load value to be 3-10 times the value of a passive microphone's output transformer. In case of transformer-coupled preamplifiers, it may be desirable to match the actual impedance values (e.g. 150 ohm-output from a passive microphone's transformer to 150 ohm-input of a preamplifier's input transformer).

Conventional methods of impedance matching or bridging between the microphone and the preamplifier include using a commonly-used impedance value at the output of the microphone and the input of the preamplifier. A less used but another conventional method of impedance matching or bridging between the microphone and the preamplifier is varying the output impedance value of a passive microphone by adjusting the microphone's passive circuitry before the output of the passive microphone is transmitted to any active power elements or a preamplifier.

These conventional methods of impedance matching or bridging are typically only used for efficient signal transmission between the microphone and the preamplifier, and are not designed to produce customized effects for various sound characteristics at a preamplifier stage. Because the preamplifier is generally the first stage for active circuit processing of a sound source signal (e.g. a passive microphone electrical signal), certain customized effects for sound characteristics (e.g. an emphasis on a mid-range audible frequency, an emphasis on treble or bass, or other intended sound effects) may be best obtained at the preamplifier stage without causing significant amount of undesirable noise or distortion to the sound source signal.

Therefore, it may be beneficial to provide a preamplifier unit that can vary impedance loading conditions to obtain customized, desired, and/or adjustable sound characteristics at the preamplifier stage. It may be also beneficial to provide various embodiments of preamplifiers with different impedance loading adjustment interfaces, which may be embodied in a standalone preamplifier unit or an integrated preamplifier unit in an active microphone casing.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a standalone phantom-powered inline preamplifier with variable impedance loading is disclosed. This standalone phantom-powered inline preamplifier comprises: a set of input terminals configured to receive a microphone electrical signal or another sound source signal, wherein the set of input terminals is operatively connected to a first set of one or more transistors inside the standalone phantom-powered inline preamplifier; a set of output terminals configured to load phantom power and also configured to transmit an amplified signal from the microphone electrical signal or another sound source signal from the set of input terminals, wherein the set of output terminal is operatively connected to a second set of one or more transistors inside the standalone phantom-powered inline preamplifier; a phantom-powered preamplifier gain circuit comprising the first set of one or more transistors, the second set of one or more transistors, and/or a resistor-capacitor network that includes a resistor and an RF shunt capacitor; and a variable impedance loading adjustable interface that enables a user to select a particular impedance loading value among a plural selection of impedance loading values available on the variable impedance loading adjustable interface, wherein the user selecting the particular impedance loading value causes a user-specified adjustment of an input impedance and/or an internal impedance of the standalone phantom-powered inline preamplifier for user-desired sound characteristics achieved by varying impedance loading.

Furthermore, in another embodiment of the invention, an integrated phantom-powered inline preamplifier with variable impedance loading in an active microphone casing is disclosed. This integrated phantom-powered inline preamplifier comprises: a set of input terminals inside the active microphone casing, wherein the set of input terminals are configured to receive a microphone electrical signal from a passive circuit portion within the active microphone casing, and wherein the set of input terminals is operatively connected to a first set of one or more transistors inside the integrated phantom-powered inline preamplifier; a set of output terminals configured to load phantom power and also configured to transmit an amplified signal from the microphone electrical signal, wherein the set of output terminal is operatively connected to a second set of one or more transistors inside the integrated phantom-powered inline preamplifier; a phantom-powered preamplifier gain circuit comprising the first set of one or more transistors, the second set of one or more transistors, and/or an resistor-capacitor network that includes a resistor and an RF shunt capacitor; and a variable impedance loading adjustable interface that enables a user to select a particular impedance loading value among a plural selection of impedance loading values available on the variable impedance loading adjustable interface, wherein the user selecting the particular impedance loading value causes a user-specified adjustment of an input impedance and/or an internal impedance of the integrated phantom-powered inline preamplifier for user-desired sound characteristics achieved by varying impedance loading.

BRIEF DESCRIPTION OF DRAWINGS

Implementations of the invention will become more apparent from the detailed description set forth below when taken in conjunction with the drawings, in which like elements bear like reference numerals.

DETAILED DESCRIPTION

Figure 1:
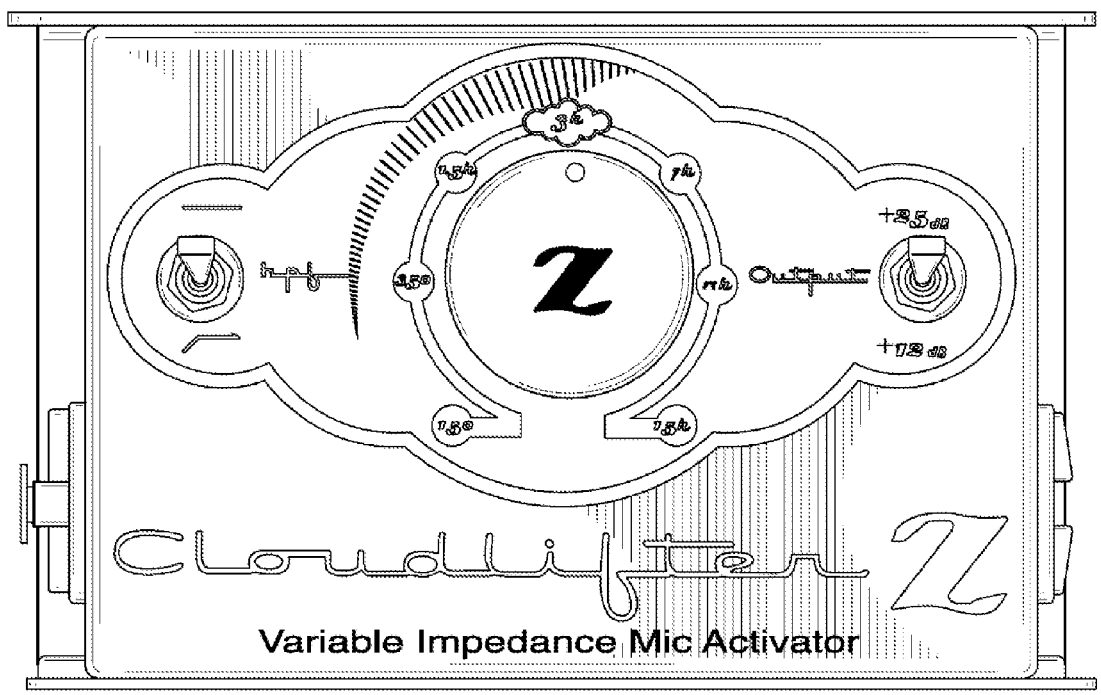
FIG. 1 shows a front perspective view of a standalone phantom-powered inline preamplifier unit with a variable impedance loading adjustment interface, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of description of shapes, configurations, and/or other symbolic representations that directly or indirectly resemble a phantom-powered inline preamplifier with variable impedance loading and adjustable interface. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

In general, embodiments of the invention relate to an audio preamplifier. More specifically, an embodiment of the invention relates to a phantom-powered preamplifier with variable impedance loading and a related adjustable interface that operates inline between a passive microphone and a secondary preamp, or between a passive microphone and a microphone interface, wherein the secondary preamp or a microphone input interface may supply phantom power (e.g. 48V) to the phantom-powered inline preamplifier. Another embodiment of the invention relates to a preamplifier with variable impedance loading, variable high pass filtering, and related adjustable interfaces. Yet another embodiment of the invention relates to a preamplifier with adjustable interfaces for variable impedance loading, variable high pass filtering, variable transformer impedance matching, and variable output gain setting, or a combination thereof. In one or more embodiments of the invention, a preamplifier may be a standalone phantom-powered inline unit or an integrated preamplifier inside an active microphone casing.

Furthermore, one objective of an embodiment of the invention is to provide a standalone phantom-powered inline preamplifier unit which receives an electrical signal from a sound source such as a microphone, wherein the standalone phantom-powered inline preamplifier unit provides an adjustable interface for variable impedance loading to obtain customized, desired, and/or adjustable sound characteristics.

Another objective of an embodiment of the invention is to provide an integrated phantom-powered inline preamplifier in an active microphone casing, wherein the integrated phantom-powered inline preamplifier receives an electrical signal from a passive circuit portion of the active microphone, and wherein the integrated phantom-powered inline preamplifier also provides an adjustable interface for variable impedance loading to obtain customized, desired, and/or adjustable sound characteristics.

Yet another objective of the invention is to provide one or more adjustable interfaces for variable high pass filtering, variable transformer impedance matching, and/or variable output gain setting of a phantom-powered inline preamplifier.

For the purpose of describing the invention, an "active microphone" is defined as a microphone with an integrated preamplifier, wherein the integrated phantom-powered inline preamplifier contains active electrical circuitry to amplify electrical signal produced by a passive electrical circuit portion of the microphone.

In addition, for the purpose of describing the invention, a "passive microphone" is defined as a microphone with passive electrical circuitry without powered components, such as integrated phantom-powered inline preamplifier, inside a microphone casing. Typically, an electrical signal outputted from a passive microphone is entirely originating from a sound pressure impacting a microphone component, such as a thin corrugated ribbon (i.e. in case of a ribbon microphone) or a diaphragm (i.e. in case of a dynamic microphone), wherein the movements of a certain microphone component induce electrical signals via a transducer. In a passive microphone, this induced electrical signal may be further transformed via passive circuitry in a microphone casing and then outputted to an output terminal, which may be connected to a standalone phantom-powered inline preamplifier unit for signal amplification.

Furthermore, for the purpose of describing the invention, "variable impedance loading" is defined as varying input impedance or internal impedance of a standalone phantom-powered inline preamplifier or an integrated phantom-powered inline preamplifier for electrical signals received from a passive microphone or a passive circuit portion of an active microphone. In general, the variable impedance loading is related to resistive impedance-based variable loading effects, wherein one or more resistors and/or a potentiometer operatively connected to an adjustable interface (e.g. a knob, a slider, a roller, a switch, and etc.) change resistive input impedance of the phantom-powered inline preamplifier. In a preferred embodiment of the invention, varying input resistive impedance or internal impedance of a standalone phantom-powered inline preamplifier for the electrical signals received form a passive microphone or a passive circuit portion of an active microphone produces customized, desired, and/or adjustable sound characteristics at the phantom-powered inline preamplifier stage.

FIG. 1 shows a front perspective view of a standalone phantom-powered inline preamplifier unit (100) with a variable impedance loading adjustment interface, in accordance with an embodiment of the invention. In general, variable impedance loading is related to resistive impedance-based variable loading effects, wherein one or more resistors and/or potentiometer operatively connected to an adjustable interface (e.g. a knob, a slider, a roller, a switch, and etc.) change resistive input impedance of the phantom-powered inline preamplifier. In a preferred embodiment of the invention, the standalone phantom-powered inline preamplifier unit has a knob as an adjustable interface for adjusting variable impedance loading value of the standalone phantom-powered inline preamplifier unit (100). In the preferred embodiment of the invention, the impedance loading value may be adjusted within a range from 150 ohms to 15,000 ohms. In another embodiment of the invention, the impedance loading value may be wider, narrower, or a subset of the range of the preferred embodiment of the invention.

In the preferred embodiment of the invention, setting the phantom-powered inline preamplifier to a low impedance loading value may emphasize mid-range audible frequency of sound over treble and/or bass, which may be desired for certain musical instruments or recording environment. For example, classical music recordings or performances, which may benefit by emphasizing mid-range audible frequency, can utilize a lower impedance loading value setting (e.g. 1.5$k$ ohms) for optimal sound recording or live concert production environment. The optimal value will vary depending on the microphone's output impedance. In general, with a higher impedance output, the optimal value may be higher. By varying impedance loading value settings, the resulting loading effects enable a user to customize and fine-tune desirable sound characteristics through the phantom-powered inline preamplifier.

On the other hand, setting the phantom-powered inline preamplifier to a high impedance loading value may increase frequency response over a broader audible frequency ranges, thereby giving an effect of stronger bass and treble in sound recording or live concert production environment. Therefore, a rock, pop, or jazz concert or recording may benefit from adjusting the impedance loading value of the phantom-powered inline preamplifier to a high impedance loading value setting (e.g. 3,000 ohms, 5,000 ohms, or higher). For example, a microphone with a 1000-ohm output impedance may sound more natural at around 10 k-ohms. In another example, a microphone with a lower impedance like 50 or 150 ohms, may sound elevated in the bass and slightly more aggressive in the top.

Impedances loading values which fall outside the range of commonly-used impedance values may produce interesting sound characteristics. For example, a very low impedance loading value may deemphasize bass and/or treble too much to produce desirable sound effects in many cases. Loading with a very low impedance may deemphasize the bass and/or treble, producing a sound with a forward midrange. However, this could be desirable in the case of an electric guitar or other source where a high amount of mid-range focus is desired. Furthermore, a very high impedance loading value may emphasize more bass and/or treble too much to make resulting sound overly bright or harsh. However, in some applications, a user may want this sound effect to produce full and crisp sound. The advantage of various embodiments of the present invention is enabling a user to set his/her own preferred impedance loading value from the phantom-powered inline preamplifier unit, depending on a particular sound production/recording environment, output impedance characteristics of the microphone, and a particular source of sound (e.g. vocal, piano, bass drum, violin, guitar, and etc.).

Phantom-powered inline preamplifiers generally utilize another preamplifier operatively connected to the phantom-powered inline preamplifier, wherein the other preamplifier provides phantom power (e.g. 48 V). With the phantom-powered inline preamplifier, the secondary preamplifier may only need to produce a smaller amount of amplification (e.g. 10-20 dB), because the inline preamplifier is providing some good amount of gain (e.g. 20 dB). Phantom-powered inline preamplifiers may be highly usefully in enabling the secondary preamplifier and/or other mixer interfaces to operate in their "sweetspot" gain ranges. For example, many secondary preamplifiers sound great when providing 20 dB of gain, but significantly deteriorate past 30-40 dB of gain.

It should be noted that conventional preamplifiers are not typically phantom-powered. Furthermore, conventional preamplifiers generally do not provide an inline preamplifier configuration, and if phantom-powered, they do not provide means or interfaces to adjust impedance loading values for electrical signals generated from a passive microphone, a passive portion of the microphone, or another sound source. At best, a conventional microphone may have passive circuit-based impedance adjustment for a microphone's output terminal to accommodate impedance matching between the microphone and the preamplifier connection. The conventional impedance matching is merely utilized for effective transmission of electrical signals from the passive microphone to the preamplifier unit. In contrast, various embodiments of the present invention are concerned with adjusting an interaction between an output signal from a passive circuitry portion of a microphone or another sound source and an initial impedance loading and gain by utilizing active (i.e. phantom powered) circuitry for a user's desired and customized sound effects, with impedance matching or bridging already established between the microphone and the preamplifier (e.g. transformer load matching, and etc.).

Continuing with FIG. 1, in one embodiment of the invention, the standalone phantom-powered inline preamplifier unit with the knob for impedance loading adjustment may additionally include one or more adjustable interfaces for other electrical parameters, such as variable high-pass filtering (VARI-HPF), transformer impedance matching (XFMR) between the phantom-powered inline preamplifier unit and the microphone, and variable output gain for output from the phantom-powered inline preamplifier unit. Furthermore, the standalone phantom-powered inline preamplifier unit also includes a power connection input jack (i.e. to receive power from phantom power from the output microphone cable fed from a secondary preamplifier supplying 48 V phantom power) and a microphone/sound source connection input jack (i.e. to receive an electrical signal from the microphone or another sound source).

In a preferred embodiment of the invention, the standalone phantom-powered inline preamplifier unit is configured to receive DC phantom power to power its active circuitry and amplifies the electrical signal from the microphone or from another sound source up to 25 db, with variable impedance loading adjustment and optionally other parameter adjustment capabilities. Furthermore, in one embodiment of the invention, the electrical signal that the standalone phantom-powered inline preamplifier unit amplifies may be originating from a musical instrument such as an acoustic guitar, a classical instrument, a bass instrument, or another electric or acoustic instrument equipped with an onboard transducer or sound pickup system. If the sound source of the electrical signal is coming from a musical instrument, then a sweep-selectable or selectable variable impedance range may be typically higher than what is used for a microphone as a sound source. For example, 1 kilo-ohms to 2 mega-ohms sweep-selectable or selectable variable impedance range may be more appropriate for at least some of the musical instruments to accommodate a higher-impedance instrument amplifier. Moreover, in another embodiment of the invention, the electrical signal that the standalone phantom-powered inline preamplifier unit amplifies may be originating from a phonograph or another source of sound which requires amplification.

Figure 2:
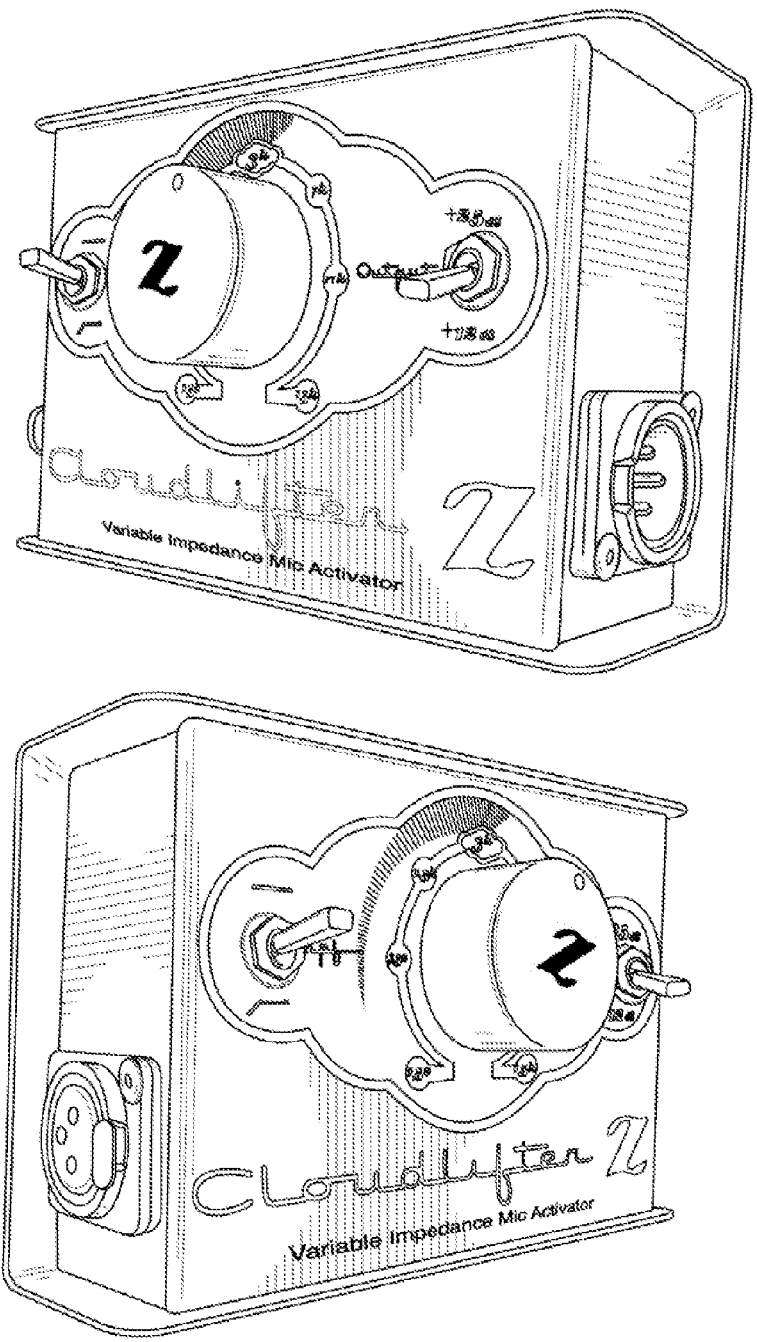
FIG. 2 shows a side perspective view of a standalone phantom-powered inline preamplifier unit with a variable impedance loading adjustment interface, in accordance with an embodiment of the invention.

FIG. 2 shows a side perspective view (200) of a standalone phantom-powered inline preamplifier unit with a variable impedance loading adjustment interface, in accordance with an embodiment of the invention. In one embodiment of the invention, a side portion or a rear portion of the standalone phantom-powered inline preamplifier unit may have one or more input/output terminals for variety of electrical connections, such as a power connection input jack (e.g. phantom power connection) and a microphone/sound source connection input jack. The side portion or the rear portion of the standalone phantom-powered inline preamplifier unit may also contain have one or more adjustable interfaces for variable impedance loading, variable high-pass filtering (VARI-HPF), transformer impedance matching (XFMR), and variable output gain for output from the phantom-powered inline preamplifier unit. In another embodiment of the invention, a front portion of the standalone phantom-powered inline preamplifier (e.g. 100 of FIG. 1) may contain most or all of the electrical connection interfaces as well as adjustment interfaces.

Figure 3:
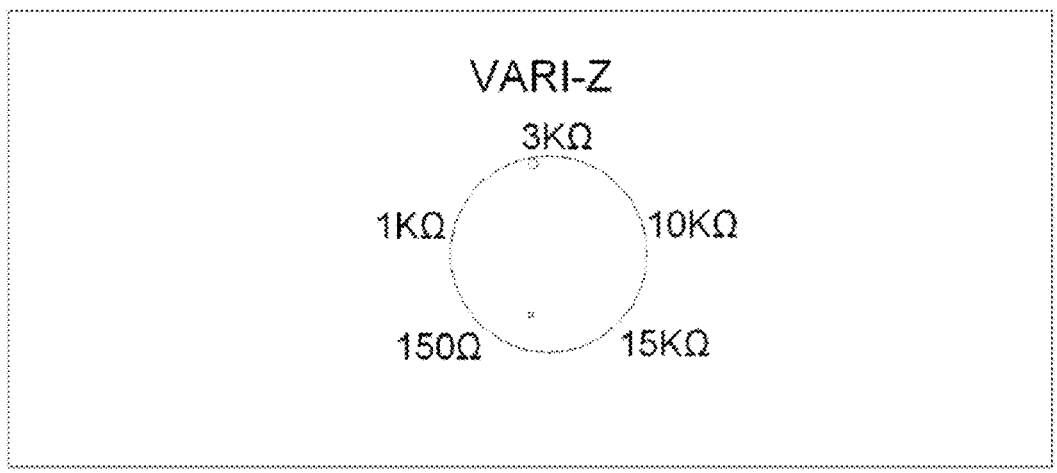
FIG. 3 shows a knob-based variable impedance loading adjustment interface, in accordance with an embodiment of the invention.

FIG. 3 shows a knob-based variable impedance loading adjustment interface called "VARI-Z" (300), in accordance with an embodiment of the invention. In general, variable impedance loading is related to resistive impedance-based variable loading effects, wherein one or more resistors and a potentiometer operatively connected to an adjustable interface (i.e. a knob) change resistive input impedance of the phantom-powered inline preamplifier. In this embodiment of the invention, the knob is configured to turn from a lowest impedance loading setting (i.e. 150 ohms) to a highest impedance loading setting (i.e. 15,000 ohms). The knob may be designed as a "sweeping" dial interface, in which the variable impedance loading adjustment can be continuously swept from the lowest impedance loading setting to the highest impedance loading setting. In another embodiment of the invention, the knob may simply be set to several preset positions along the knob's path of rotation (e.g. 150 ohms, 1,000 ohms, 3,000 ohms, 10,000 ohms, 15,000 ohms, and etc.).

Furthermore, the knob-based variable impedance loading adjustment interface called "VARI-Z" (300) may be on a surface of a phantom-powered inline preamplifier unit, or alternatively be located on a surface of an active microphone casing containing an integrated phantom-powered inline preamplifier.

Figure 4:
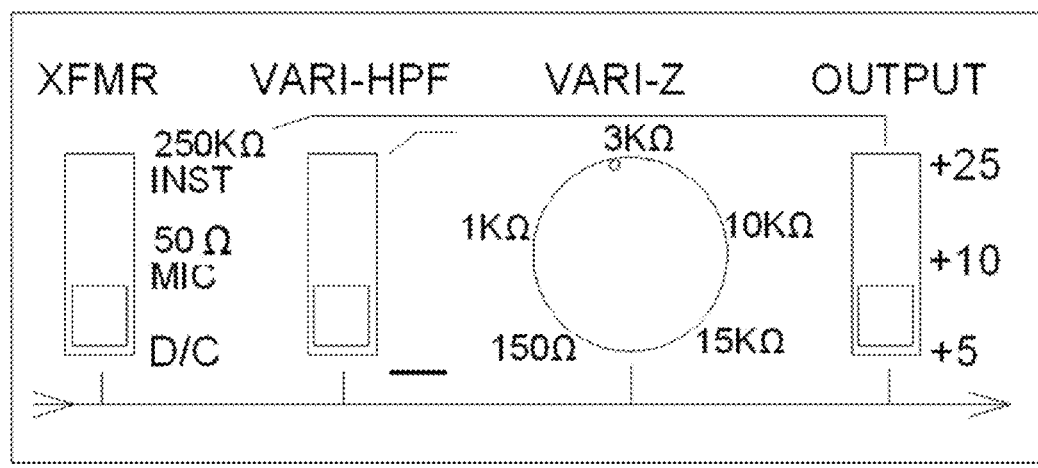
FIG. 4 shows a knob-based variable impedance loading adjustment interface with optional features such as a transformer impedance matching interface, a high-pass filter adjustment interface, and an output gain adjustment interface, in accordance with an embodiment of the invention.

FIG. 4 shows a knob-based variable impedance loading adjustment interface (VARI-Z) (400) with optional features such as a transformer impedance matching interface (XFMR), a high-pass filter adjustment interface (VARI-HPF), and an output gain adjustment interface (OUTPUT), in accordance with an embodiment of the invention.

Similar to FIG. 3, in this embodiment of the invention, the knob for variable impedance loading is configured to turn from a lowest impedance loading setting (i.e. 150 ohms) to a highest impedance loading setting (i.e. 15,000 ohms). The knob may be designed as a "sweeping" dial interface, in which the variable impedance loading adjustment can be continuously swept from the lowest impedance loading setting to the highest impedance loading setting. In another embodiment of the invention, the knob may simply be set to several preset positions along the knob's path of rotation (e.g. 150 ohms, 1,000 ohms, 3,000 ohms, 10,000 ohms, 15,000 ohms, and etc.).

In addition, in this embodiment of the invention, the transformer impedance matching interface (XFMR) has several modes of operation, including a direct-coupled (DC) mode, a 50 ohm microphone mode, and a 250 k-ohm instrument mode. If the phantom-powered inline preamplifier uses transformer impedance matching between the phantom-powered inline preamplifier and a microphone, then the transformer impedance matching interface (XFMR) enables adjustable impedance matching modes to accommodate the microphone's transformer impedance, or an instrument's transformer or inherent impedance with the phantom-powered inline preamplifier. Alternatively, the transformer impedance matching interface (XFMR) can simply provide a direct-coupling between the output of a sound source (e.g. a microphone, an instrument, and etc.) and the phantom-powered inline preamplifier, which may use resistive impedance instead of transformer impedance.

In addition, the high-pass filter adjustment interface (VARI-HPF) on the phantom-powered inline preamplifier may provide a bass-range reduction or cut (e.g. frequency reduction or cut below 40 Hz, 100 Hz, 300 Hz, and etc.), if the high-pass filter is enabled. Moreover, the output gain adjustment interface (OUTPUT) can provide a way to set a desired output signal gain value (e.g. 5 dB, 10, dB, 25 dB, and etc.) for an output terminal of the phantom-powered inline preamplifier.

Furthermore, the knob-based variable impedance loading adjustment interface (VARI-Z) (400) with optional features such as a transformer impedance matching interface (XFMR), a high-pass filter adjustment interface (VARI-HPF), and an output gain adjustment interface (OUTPUT) may be on a surface of a standalone phantom-powered inline preamplifier unit, or alternatively be located on a surface of an active microphone casing containing an integrated phantom-powered inline preamplifier.

Figure 5:
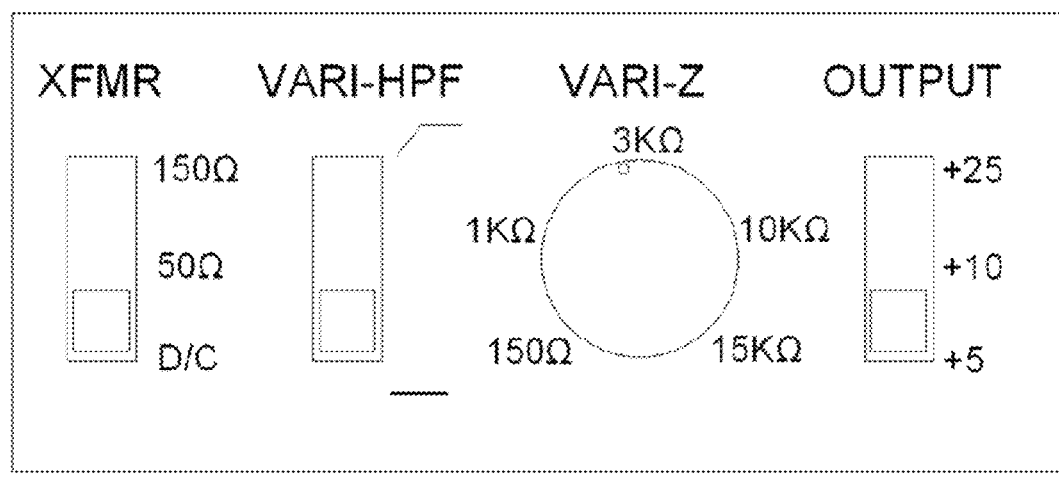
FIG. 5 shows another knob-based variable impedance loading adjustment interface with optional features such as a transformer impedance matching interface, a high-pass filter adjustment interface, and an output gain adjustment interface, in accordance with an embodiment of the invention.

FIG. 5 shows another knob-based variable impedance loading adjustment interface (VARI-Z) (500) with optional features such as a transformer impedance matching interface (XFMR), a high-pass filter adjustment interface (VARI-HPF), and an output gain adjustment interface (OUTPUT), in accordance with an embodiment of the invention.

Similar to FIG. 4, in this embodiment of the invention, the knob for variable impedance loading is configured to turn from a lowest impedance loading setting (i.e. 150 ohms) to a highest impedance loading setting (i.e. 15,000 ohms). The knob may be designed as a "sweeping" dial interface, in which the variable impedance loading adjustment can be continuously swept from the lowest impedance loading setting to the highest impedance loading setting. In another embodiment of the invention, the knob may simply be set to several preset positions along the knob's path of rotation (e.g. 150 ohms, 1,000 ohms, 3,000 ohms, 10,000 ohms, 15,000 ohms, and etc.).

In addition, in this embodiment of the invention, the transformer impedance matching interface (XFMR) has several modes of operation, including a direct-coupled (DC) mode, a 50 ohm microphone mode, and a 150 ohm mode. If the phantom-powered inline preamplifier uses transformer impedance matching between the phantom-powered inline preamplifier and a microphone, then the transformer impedance matching interface (XFMR) enables adjustable impedance matching modes to accommodate the microphone's transformer impedance, or an instrument's transformer or inherent impedance with the phantom-powered inline preamplifier. Alternatively, the transformer impedance matching interface (XFMR) can be bypassed by switching into a direct-coupling (DC) mode, allowing direct-coupling between the output of a sound source (e.g. a microphone, an instrument, and etc.) and the phantom-powered inline preamplifier, which may use resistive impedance (VARI-Z) instead of transformer impedance to provide the impedance control.

In addition, the high-pass filter adjustment interface (VARI-HPF) on the phantom-powered inline preamplifier may provide a bass-range reduction or cut (e.g. frequency reduction or cut below 40 Hz, 100 Hz, 300 Hz, and etc.), if the high-pass filter is enabled. Moreover, the output gain adjustment interface (OUTPUT) can provide a way to set a desired output signal gain value (e.g. 5 dB, 10, dB, 25 dB, and etc.) for an output terminal of the phantom-powered inline preamplifier.

Furthermore, the knob-based variable impedance loading adjustment interface (VARI-Z) (500) with optional features such as a transformer impedance matching interface (XFMR), a high-pass filter adjustment interface (VARI-HPF), and an output gain adjustment interface (OUTPUT) may be on a surface of a standalone phantom-powered inline preamplifier unit, or alternatively be located on a surface of an active microphone casing containing an integrated phantom-powered inline preamplifier.

Figure 6:
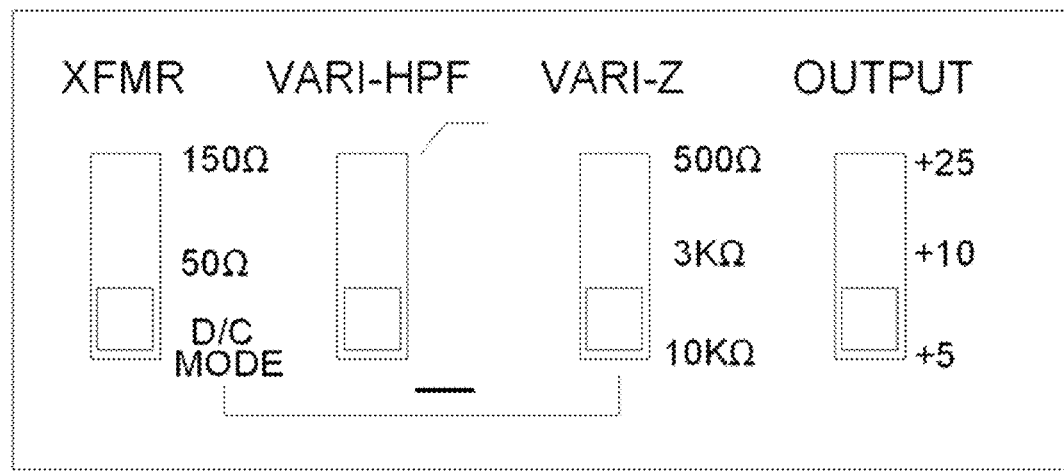
FIG. 6 shows a slider-based variable impedance loading adjustment interface with optional features such as a transformer impedance matching interface, a high-pass filter adjustment interface, and an output gain adjustment interface, in accordance with an embodiment of the invention.

FIG. 6 shows a slider-based variable impedance loading adjustment interface (VARI-Z) (600) with optional features such as a transformer impedance matching interface (XFMR), a high-pass filter adjustment interface (VARI-HPF), and an output gain adjustment interface (OUTPUT), in accordance with an embodiment of the invention. In D/C mode, the transformer is bypassed and impedance is controlled by the slider labeled "Vari-Z". This switches impedance adjustment from a transformer-based impedance matching to a D/C resistive method of adjusting the impedance (VARI-Z). Other than the fact that the variable impedance loading adjustment interface (VARI-Z) is a slider element, which can be set to specific positions (e.g. 10 k-ohms, 3 k-ohms, 500 ohms), adjustment interfaces and their features shown in FIG. 5 are very similar to those described for FIG. 5.

Figure 7:
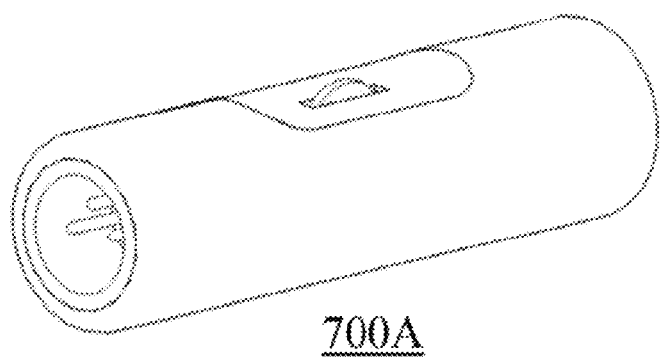
FIG. 7 shows several views of a cylindrical casing encapsulating a phantom-powered inline preamplifier and a roller-based variable impedance loading adjustment interface, in accordance with an embodiment of the invention.
Figure 7:
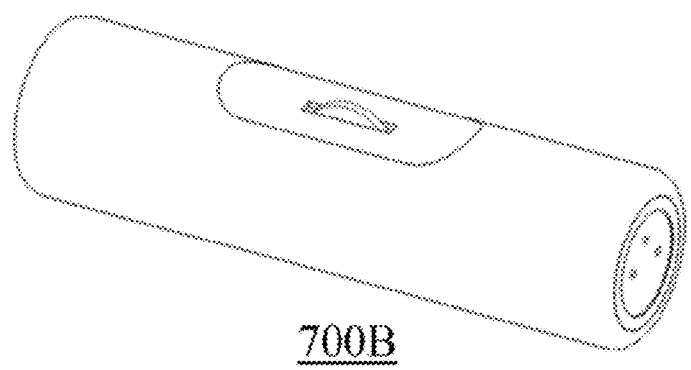
Figure 7:
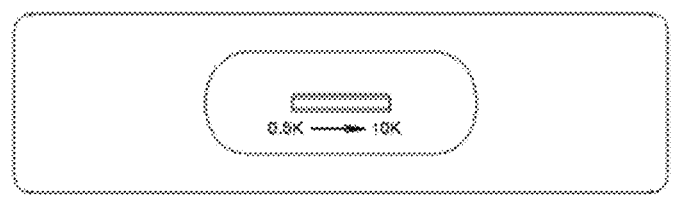
Figure 7:
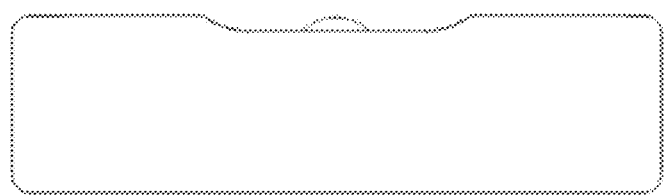

FIG. 7 shows several views (700A, 700B, 700C, 700D) of a cylindrical casing encapsulating a phantom-powered inline preamplifier and a roller-based variable impedance loading adjustment interface, in accordance with an embodiment of the invention. In this embodiment of the invention, variable impedance loading is related to resistive impedance-based variable loading effects, wherein one or more resistors and a potentiometer operatively connected to an adjustable interface (i.e. a roller) change resistive input impedance of the phantom-powered inline preamplifier inside the cylindrical casing.

In this embodiment of the invention, a roller on a surface of the cylindrical casing encapsulating the phantom-powered inline preamplifier is configured to rotate from a lowest impedance loading setting (i.e. 0.5 k-ohms) to a highest impedance loading setting (i.e. 10 k-ohms). The roller may be designed as a "sweeping" roller interface, in which the variable impedance loading adjustment can be continuously swept from the lowest impedance loading setting to the highest impedance loading setting. In another embodiment of the invention, the roller may simply be set to several preset positions along the roller's path of rotation (e.g. 0.5 k-ohms, 10 k-ohms, and etc.).

Figure 8:
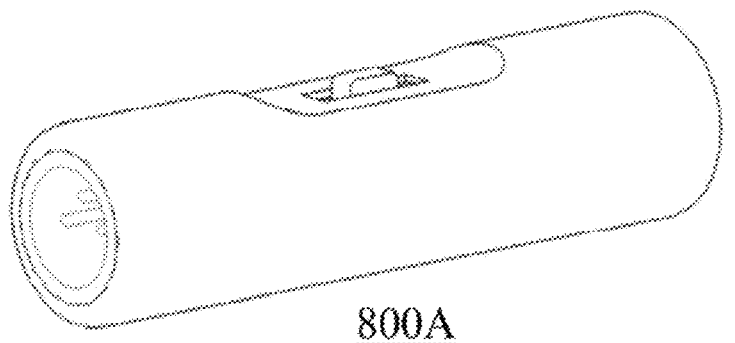
FIG. 8 shows several views of a cylindrical casing encapsulating a phantom-powered inline preamplifier and a slider-based variable impedance loading adjustment interface, in accordance with an embodiment of the invention.
Figure 8:
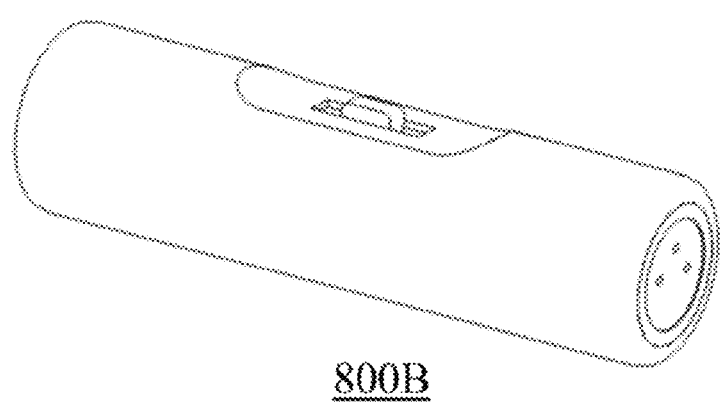
Figure 8:
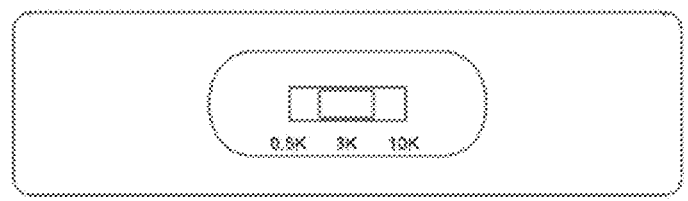
Figure 8:
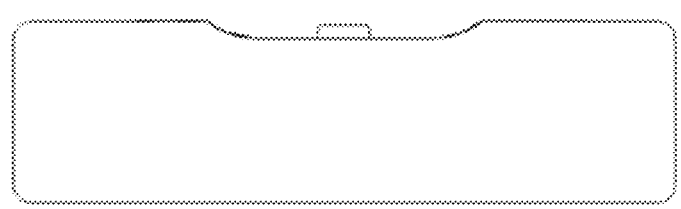

FIG. 8 shows several views (800A, 800B, 800C, 800D) of a cylindrical casing encapsulating a phantom-powered inline preamplifier and a slider-based variable impedance loading adjustment interface, in accordance with an embodiment of the invention. In this embodiment of the invention, variable impedance loading is related to resistive impedance-based variable loading effects, wherein one or more resistors and a potentiometer operatively connected to an adjustable interface (i.e. a slider) change resistive input impedance of the phantom-powered inline preamplifier inside the cylindrical casing In this embodiment of the invention, a slider on a surface of the cylindrical casing is configured to slide into a set position, including a lowest impedance loading setting (i.e. 0.5 k-ohms), a mid-range impedance setting (i.e. 3 k-ohms), a highest impedance loading setting (i.e. 10 k-ohms).

Figure 9:
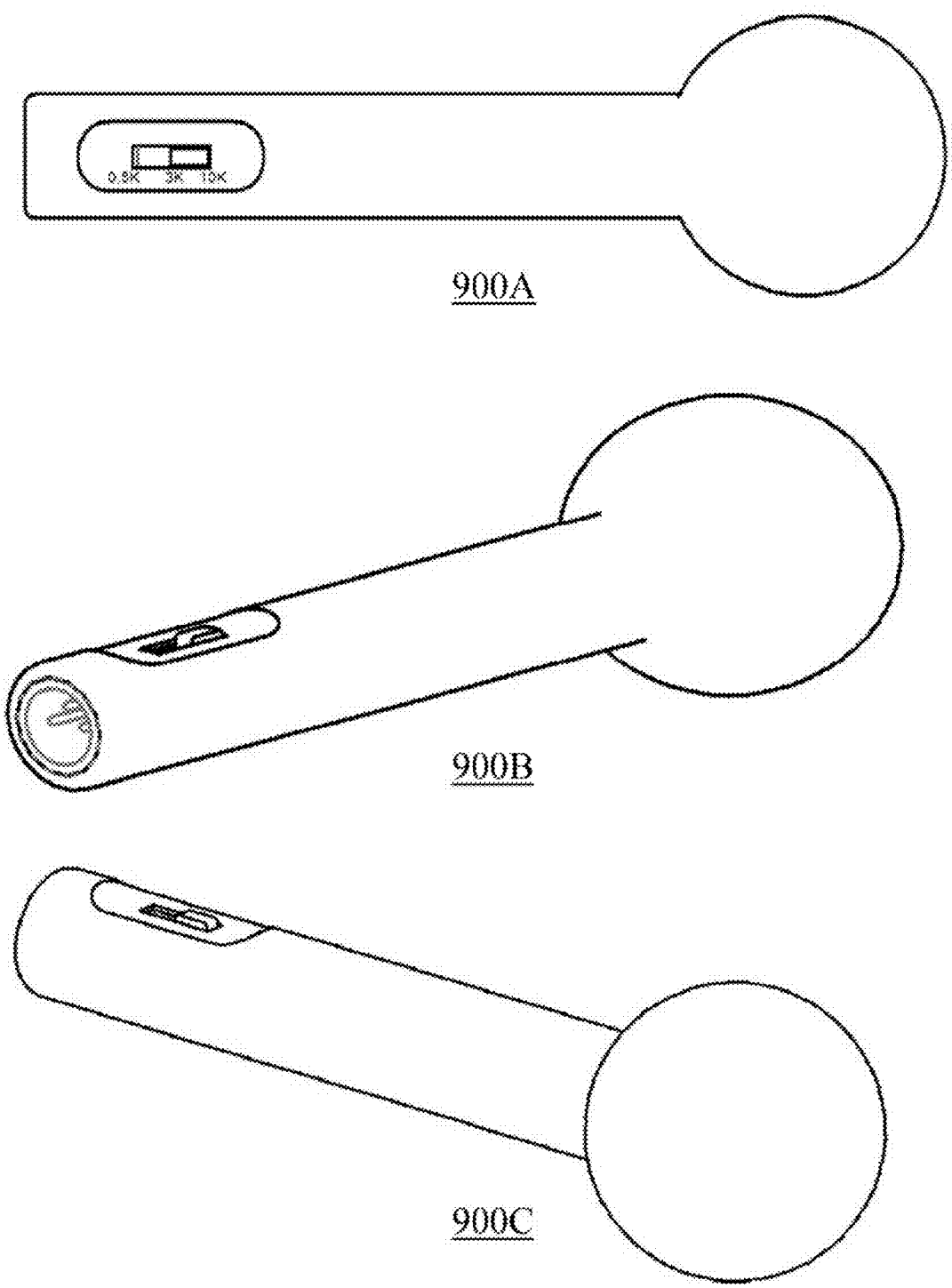
FIG. 9 shows several views of an active microphone casing which incorporates an internally-integrated phantom-powered preamplifier and a slider-based variable impedance loading adjustment interface, in accordance with an embodiment of the invention.

FIG. 9 shows several views (900A, 900B, 900C) of an active microphone casing which incorporates a phantom-powered inline preamplifier and a slider-based variable impedance loading adjustment interface, in accordance with an embodiment of the invention. In this embodiment of the invention, variable impedance loading is related to resistive impedance-based variable loading effects, wherein one or more resistors and a potentiometer operatively connected to an adjustable interface (i.e. a slider) change resistive input impedance of the phantom-powered inline preamplifier inside the active microphone casing In this embodiment of the invention, a slider on a surface of the active microphone casing is configured to slide into a set position, including a lowest impedance loading setting (i.e. 0.5 k-ohms), a mid-range impedance setting (i.e. 3 k-ohms), a highest impedance loading setting (i.e. 10 k-ohms).

Figure 10:
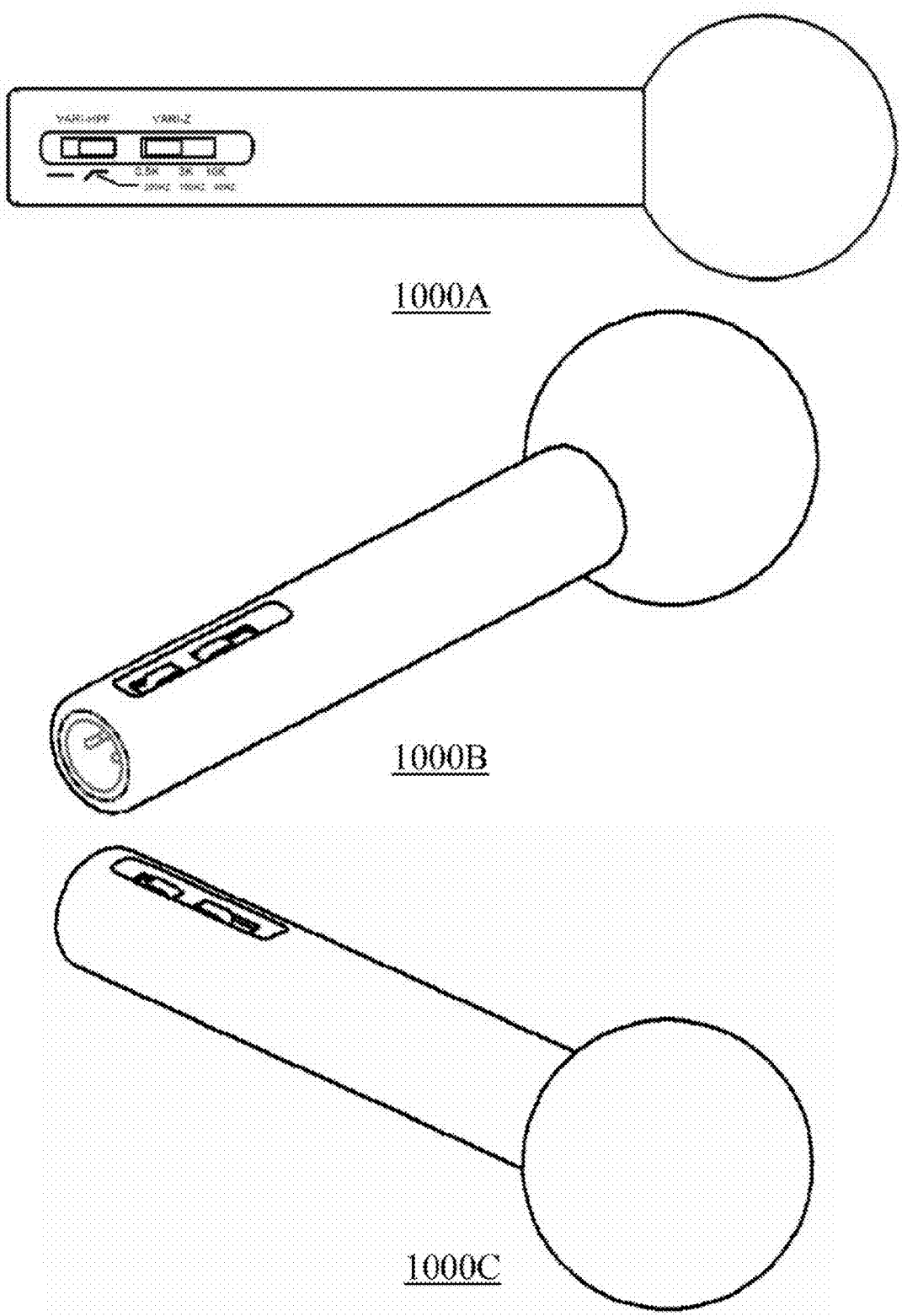
FIG. 10 shows several views of another active microphone casing which incorporates a phantom-powered inline preamplifier, a slider-based variable impedance loading adjustment interface, and a variable high-pass filter interface, in accordance with an embodiment of the invention.

FIG. 10 shows several views (1000A, 1000B, 1000C) of another active microphone casing which incorporates a phantom-powered inline preamplifier, a slider-based variable impedance loading adjustment interface, and a variable high-pass filter interface, in accordance with an embodiment of the invention. In this embodiment of the invention, variable impedance loading is related to resistive impedance-based variable loading effects, wherein one or more resistors and/or a potentiometer operatively connected to an adjustable interface (i.e. a slider) change resistive input impedance of the integrated phantom-powered inline preamplifier inside the active microphone casing.

In this embodiment of the invention, a slider for variable impedance loading (VARI-Z) on a surface of the active microphone casing is configured to slide into a set position, including a lowest impedance loading setting (i.e. 0.5 k-ohms), a mid-range impedance setting (i.e. 3 k-ohms), a highest impedance loading setting (i.e. 10 k-ohms). Furthermore, a slider for variable high-pass filter (VARI-HPF) on the surface of the active microphone casing is configured to slide to multiple positions to adjust values of the variable high-pass filter. In this embodiment of the invention, the slider used as a high-pass filter adjustment interface (VARI-HPF) on the active microphone with the integrated phantom-powered inline preamplifier may provide a bass-range reduction or cut (e.g. frequency reduction or cut below 40 Hz, 100 Hz, and 300 Hz), if the high-pass filter is enabled.

In one embodiment of the invention, changing an impedance loading value (e.g. 0.5 k-ohms, 3 k-ohms, 10 k-ohms, and etc.) also impacts the cutoff values for the high pass filter. For example, setting the variable impedance loading value to 10 k-ohms may have an effect on the high pass filter to make its cutoff value be somewhere around 40 Hz, if the high pass filter is turned on.

Figure 11:
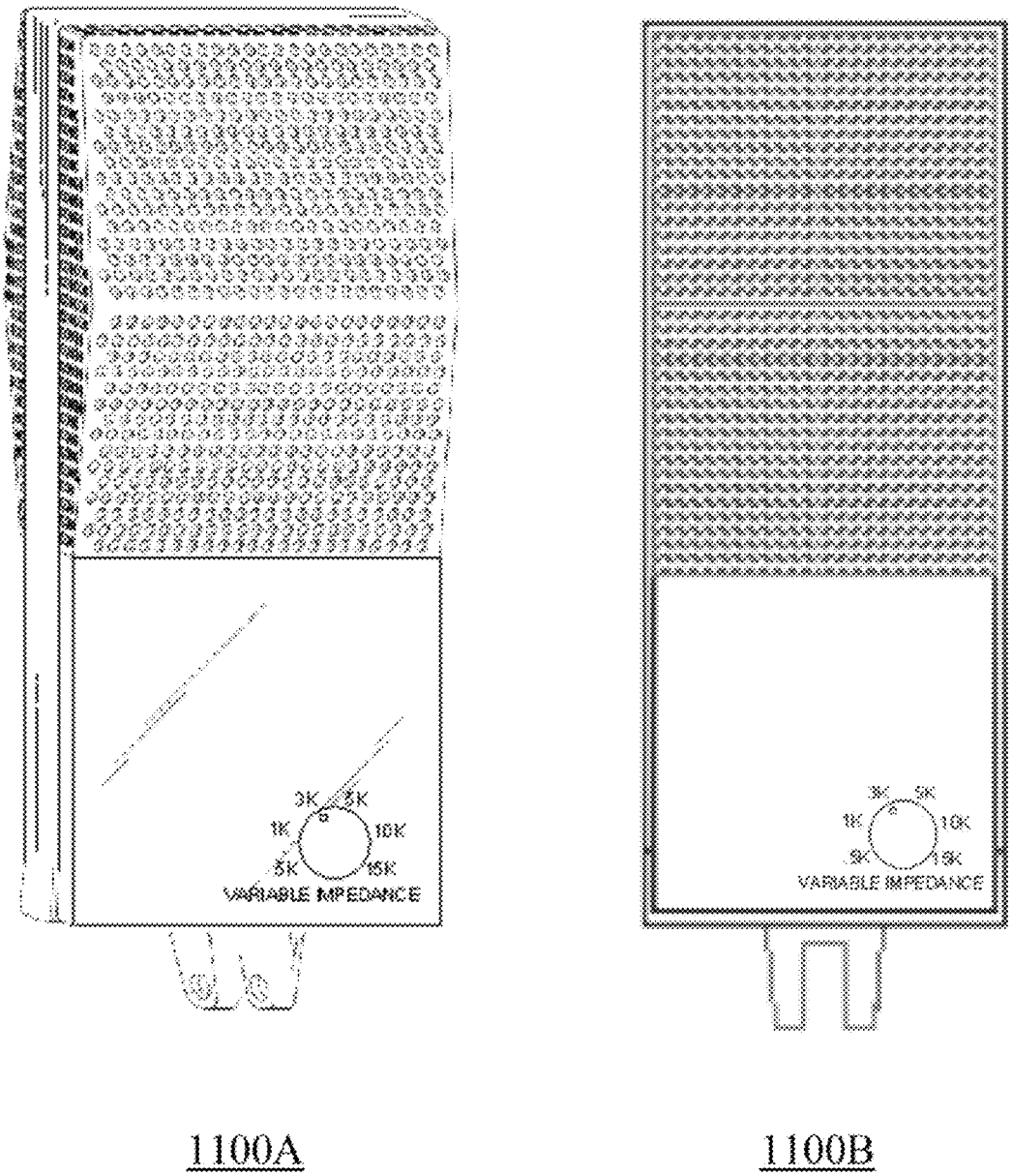
FIG. 11 shows several views of an active ribbon microphone casing which incorporates a phantom-powered inline preamplifier and a knob-based variable impedance loading adjustment interface, in accordance with an embodiment of the invention.

FIG. 11 shows several views (1100A, 1100B) of an active ribbon microphone casing which incorporates a phantom-powered inline preamplifier and a knob-based variable impedance loading adjustment interface, in accordance with an embodiment of the invention. In this embodiment of the invention, variable impedance loading is related to resistive impedance-based variable loading effects, wherein one or more resistors and a potentiometer operatively connected to an adjustable interface (i.e. a knob) change resistive input impedance of the integrated phantom-powered inline preamplifier inside the active ribbon microphone casing.

In this embodiment of the invention, the knob on a front surface or a rear surface of the active ribbon microphone casing is configured to rotate from a lowest impedance loading setting (i.e. 0.5 k-ohms) to a highest impedance loading setting (i.e. 15 k-ohms). The knob may be designed as a "sweeping" rotating interface, in which the variable impedance loading adjustment can be continuously swept from the lowest impedance loading setting to the highest impedance loading setting. In another embodiment of the invention, the knob may simply be set to several preset positions along the knob's path of rotation (e.g. 0.5 k-ohms, 1 k-ohms, 3 k-ohms, 5 k-ohms, 10 k-ohms, 15 k-ohms, and etc.).

Figure 12:
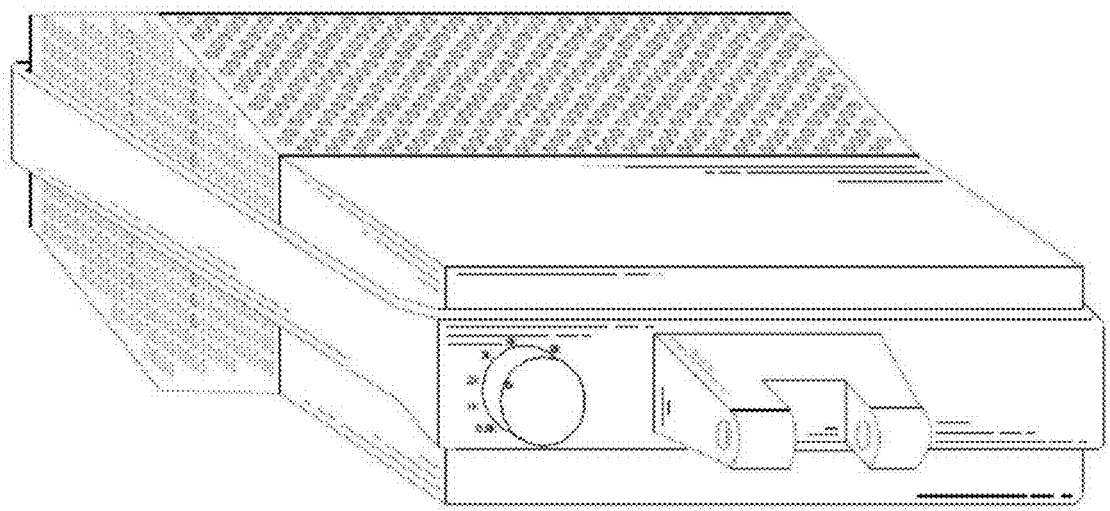
FIG. 12 shows a bottom perspective view of another active ribbon microphone casing which incorporates a phantom-powered inline preamplifier and a knob-based variable impedance loading adjustment interface, in accordance with an embodiment of the invention.

FIG. 12 shows several views of another active ribbon microphone casing which incorporates a phantom-powered inline preamplifier and a knob-based variable impedance loading adjustment interface, in accordance with an embodiment of the invention. Other than the fact that the active ribbon microphone casing as shown in FIG. 12 embodies a knob on a bottom surface of the active ribbon microphone casing, the variable loading adjustment interface and its features using the knob in this embodiment of the invention are very similar to those described for FIG. 11.

Figure 13:
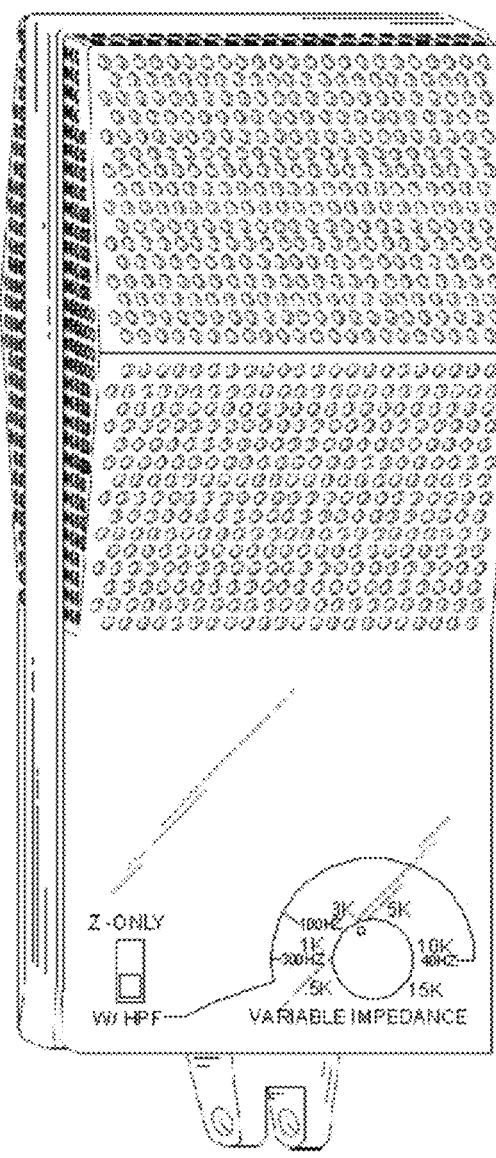
FIG. 13 shows several views of an active ribbon microphone casing which incorporates a phantom-powered inline preamplifier, a knob-based variable impedance loading adjustment interface, and a high-pass filter adjustment interface, in accordance with an embodiment of the invention.
Figure 13:
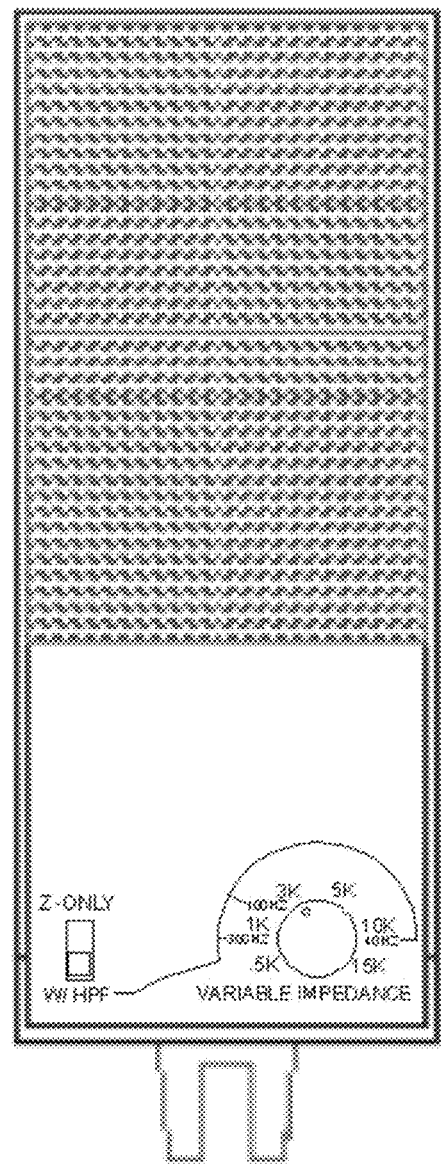

FIG. 13 shows several views (1300A, 1300B) of an active ribbon microphone casing which incorporates a phantom-powered inline preamplifier, a knob-based variable impedance loading adjustment interface, and a high-pass filter adjustment interface, in accordance with an embodiment of the invention. In this embodiment of the invention, variable impedance loading is related to resistive impedance-based variable loading effects, wherein one or more resistors and a potentiometer operatively connected to an adjustable interface (i.e. a knob) change resistive input impedance of the integrated phantom-powered inline preamplifier inside the active ribbon microphone casing.

In this embodiment of the invention, the knob on a surface of the active ribbon microphone casing is configured to rotate from a lowest impedance loading setting (i.e. 0.5 k-ohms) to a highest impedance loading setting (i.e. 15 k-ohms). The knob may be designed as a "sweeping" dial interface, in which the variable impedance loading adjustment can be continuously swept from the lowest impedance loading setting to the highest impedance loading setting. In another embodiment of the invention, the knob may simply be set to several preset positions along the knob's path of rotation (e.g. 0.5 k-ohms, 1 k-ohms, 3 k-ohms, 5 k-ohms, 10 k-ohms, 15 k-ohms, and etc.).

Furthermore, in the embodiment of the invention as shown in FIG. 13, a slider for variable high-pass filter on the surface of the active ribbon microphone casing is configured to slide to multiple positions (e.g. impedance (Z)-only mode, HPF enable mode (W/HPF), HPF adjustment for cutoff values of 40 Hz, 100 Hz, 300 Hz, and etc.) to adjust values of the variable high-pass filter. In this embodiment of the invention, the slider used as a high-pass filter adjustment interface on the active ribbon microphone with the integrated phantom-powered inline preamplifier may provide a bass-range reduction or cut (e.g. frequency reduction or cut below 40 Hz, 100 Hz, 300 Hz), if the high-pass filter is enabled.

In one embodiment of the invention, changing an impedance loading value (e.g. 1 k-ohms, 3 k-ohms, 10 k-ohms, and etc.) also impacts the cutoff values for the high pass filter. For example, setting the variable impedance loading value to 1 k-ohms may have an effect on the high pass filter to make its cutoff value be somewhere around 300 Hz, if the high pass filter is turned on. Likewise, setting the variable impedance loading value to 10 k-ohms may have an effect on the high pass filter to make its cutoff value be somewhere around 40 Hz, if the high pass filter is turned on.

Figure 14:
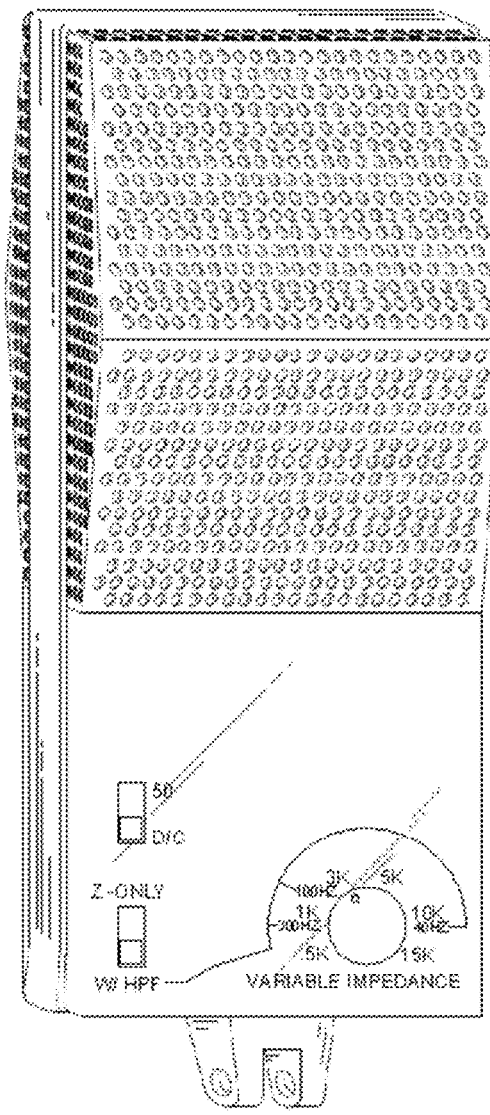
FIG. 14 shows several views of an active ribbon microphone casing which incorporates a phantom-powered inline preamplifier, a knob-based variable impedance loading adjustment interface, a high-pass filter adjustment interface, and a transformer impedance matching interface, in accordance with an embodiment of the invention.
Figure 14:
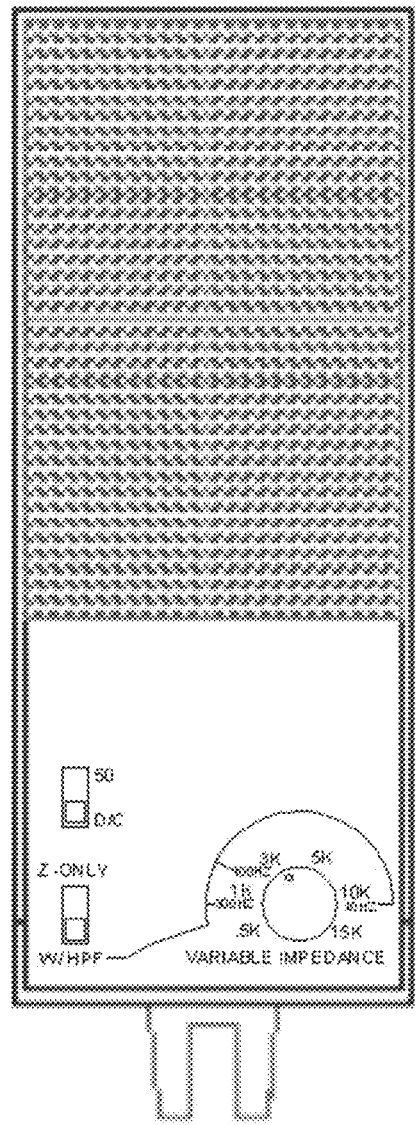

FIG. 14 shows several views (1400A, 1400B) of an active ribbon microphone casing which incorporates a phantom-powered inline preamplifier, a knob-based variable impedance loading adjustment interface, a high-pass filter adjustment interface, and a transformer impedance matching interface, in accordance with an embodiment of the invention. In this embodiment of the invention, variable impedance loading is related to resistive impedance-based variable loading effects, wherein one or more resistors and a potentiometer operatively connected to an adjustable interface (i.e. a knob) change resistive input impedance of the integrated phantom-powered inline preamplifier inside the active ribbon microphone casing.

In this embodiment of the invention, the knob on a surface of the active ribbon microphone casing is configured to rotate from a lowest impedance loading setting (i.e. 0.5 k-ohms) to a highest impedance loading setting (i.e. 15 k-ohms). The knob may be designed as a "sweeping" dial interface, in which the variable impedance loading adjustment can be continuously swept from the lowest impedance loading setting to the highest impedance loading setting. In another embodiment of the invention, the knob may simply be set to several preset positions along the knob's path of rotation (e.g. 0.5 k-ohms, 1 k-ohms, 3 k-ohms, 5 k-ohms, 10 k-ohms, 15 k-ohms, and etc.).

Furthermore, in the embodiment of the invention as shown in FIG. 14, a slider for variable high-pass filter on the surface of the active ribbon microphone casing is configured to slide to multiple positions (e.g. impedance (Z)-only mode, HPF enable mode (W/HPF), HPF adjustment for cutoff values of 40 Hz, 100 Hz, 300 Hz, and etc.) to adjust values of the variable high-pass filter. In this embodiment of the invention, the slider used as a high-pass filter adjustment interface on the active ribbon microphone with the integrated phantom-powered inline preamplifier may provide a bass-range reduction or cut (e.g. frequency reduction or cut below 40 Hz, 100 Hz, or 300 Hz), if the high-pass filter is enabled.

In one embodiment of the invention, changing an impedance loading value (e.g. 1 k-ohms, 3 k-ohms, 10 k-ohms, and etc.) also impacts the cutoff values for the high pass filter. For example, setting the variable impedance loading value to 1 k-ohms may have an effect on the high pass filter to make its cutoff value be somewhere around 300 Hz, if the high pass filter is turned on. Likewise, setting the variable impedance loading value to 10 k-ohms may have an effect on the high pass filter to make its cutoff value be somewhere around 40 Hz, if the high pass filter is turned on.

In addition, the active ribbon microphone casing as shown in FIG. 14 also has a transformer impedance matching interface with several modes of operation, including a direct-coupled (DC) mode, and a 50 ohm transformer-coupled mode. This provides the user a choice between a transformer-based impedance matching (50 ohm transformer impedance matching) and a direct coupling (DC) to the integrated inline phantom-powered preamplifier to allow resistive impedance matching. Providing this selectivity between the two modes may be useful because the sound characteristics are influenced by the transformer, which can be desirable in some applications. By having a D/C mode which enables resistive impedance adjustments using the variable impedance interface (i.e. instead of transformer-based impedance matching), various embodiments of the present invention, including an embodiment shown in FIG. 14, provides flexible impedance adjustment options.

Figure 15:
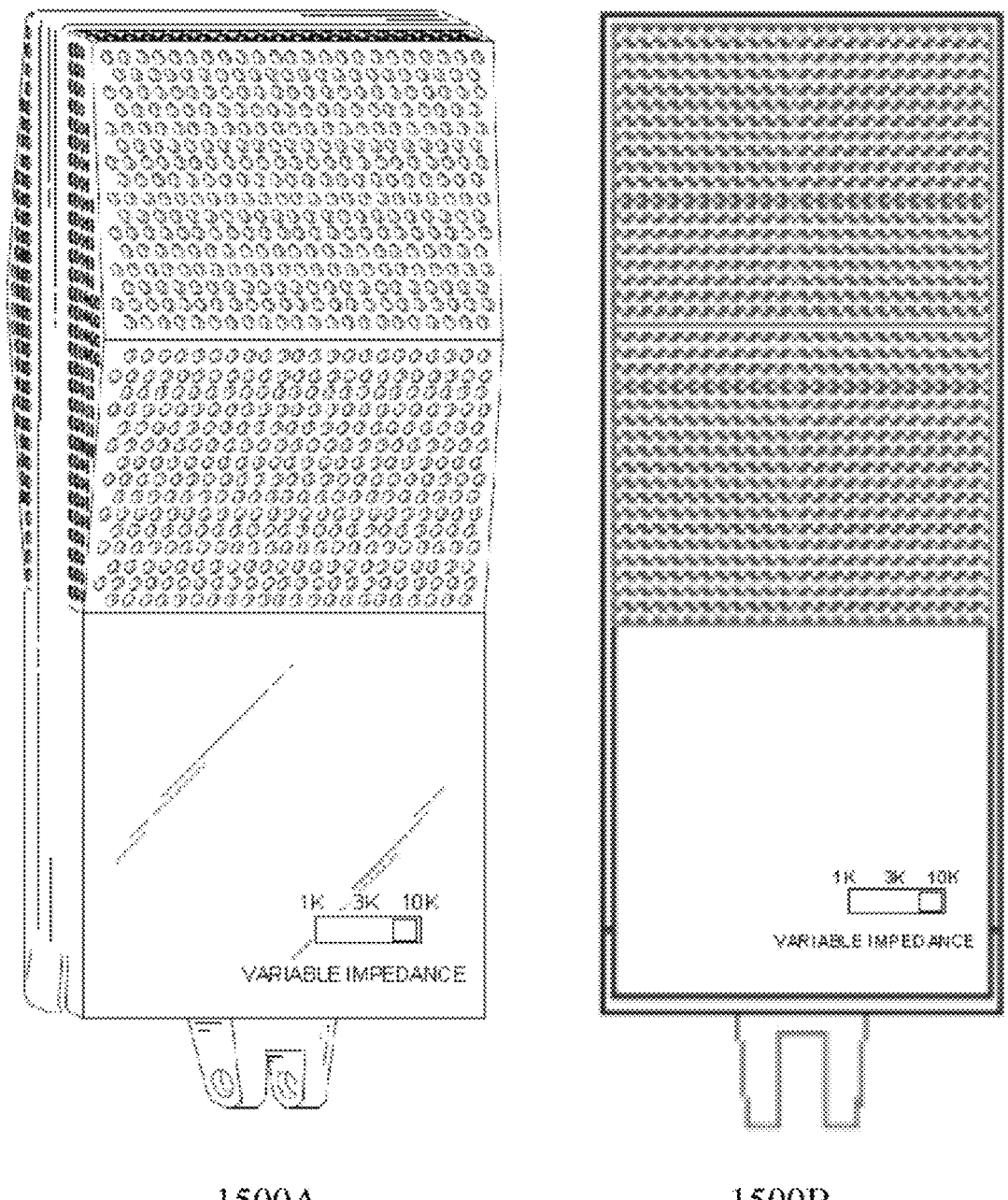
FIG. 15 shows several views of an active ribbon microphone casing which incorporates a phantom-powered inline preamplifier and a slider-based variable impedance loading adjustment interface, in accordance with an embodiment of the invention.

FIG. 15 shows several views (1500A, 1500B) of an active ribbon microphone casing which incorporates a phantom-powered inline preamplifier and a slider-based variable impedance loading adjustment interface, in accordance with an embodiment of the invention. In this embodiment of the invention, variable impedance loading is related to resistive impedance-based variable loading effects, wherein one or more resistors and/or potentiometer operatively connected to an adjustable interface (i.e. a slider) change resistive input impedance of the integrated phantom-powered inline preamplifier inside the active ribbon microphone casing.

In this embodiment of the invention, the slider on a surface of the active ribbon microphone casing is configured to slide from a lowest impedance loading setting (i.e. 1 k-ohms) to a highest impedance loading setting (i.e. 10 k-ohms). The slider may be designed as a continuously-sliding interface, in which the variable impedance loading adjustment can be continuously swept from the lowest impedance loading setting to the highest impedance loading setting. In another embodiment of the invention, the slider may simply be set to several preset positions along the slider's path (e.g. 1 k-ohms, 3 k-ohms, 10 k-ohms, and etc.).

Figure 16:
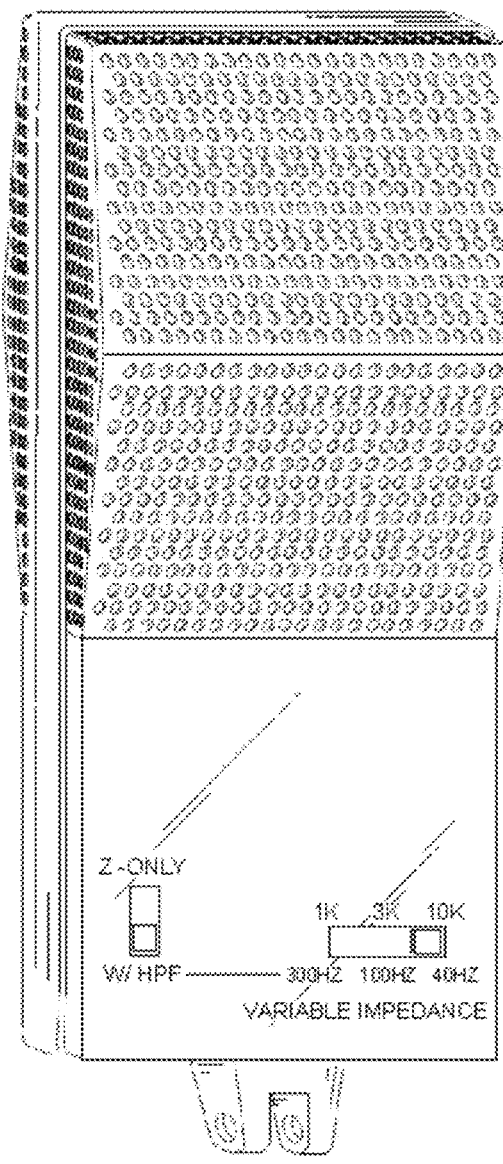
FIG. 16 shows several views of an active ribbon microphone casing which incorporates a phantom-powered inline preamplifier, a slider-based variable impedance loading adjustment interface, and a high-pass filter adjustment interface, in accordance with an embodiment of the invention.
Figure 16:
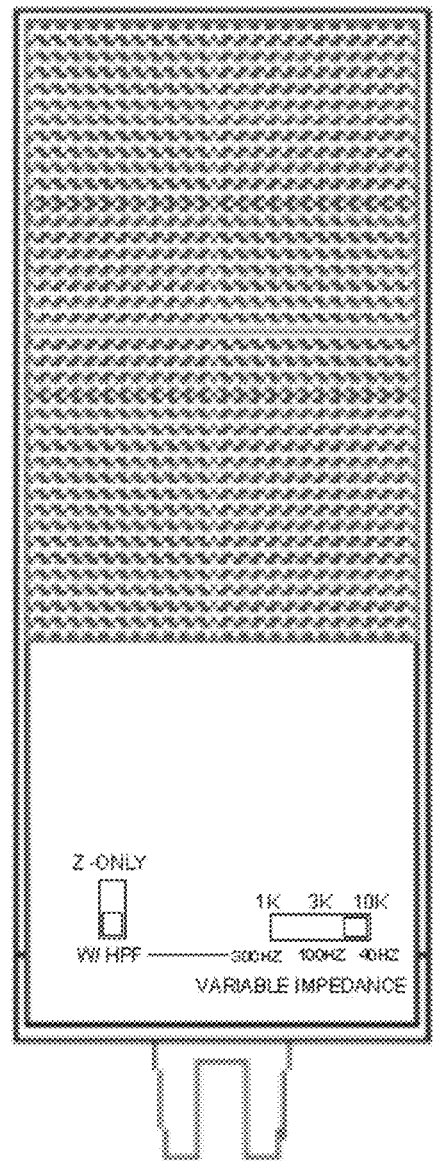

FIG. 16 shows several views (1600A, 1600B) of an active ribbon microphone casing which incorporates a phantom-powered inline preamplifier, a slider-based variable impedance loading adjustment interface, and a high-pass filter adjustment interface, in accordance with an embodiment of the invention. In this embodiment of the invention, variable impedance loading is related to resistive impedance-based variable loading effects, wherein one or more resistors and a potentiometer operatively connected to an adjustable interface (i.e. a slider) change resistive input impedance of the integrated phantom-powered inline preamplifier inside the active ribbon microphone casing.

In this embodiment of the invention, the slider on a surface of the active ribbon microphone casing is configured to slide from a lowest impedance loading setting (i.e. 1 k-ohms) to a highest impedance loading setting (i.e. 10 k-ohms). The slider may be designed as a continuously-sliding interface, in which the variable impedance loading adjustment can be continuously swept from the lowest impedance loading setting to the highest impedance loading setting. In another embodiment of the invention, the slider may simply be set to several preset positions along the slider's path (e.g. 1 k-ohms, 3 k-ohms, 10 k-ohms, and etc.).

Furthermore, in the embodiment of the invention as shown in FIG. 16, a slider for variable high-pass filter on the surface of the active ribbon microphone casing is configured to slide to multiple positions (e.g. impedance (Z)-only mode, HPF enable mode (W/HPF), HPF adjustment for cutoff values of 40 Hz, 100 Hz, 300 Hz, and etc.) to adjust values of the variable high-pass filter. In this embodiment of the invention, the slider used as a high-pass filter adjustment interface on the active ribbon microphone with the integrated phantom-powered inline preamplifier may provide a bass-range reduction or cut (e.g. frequency reduction or cut below 40 Hz, 100 Hz, 300 Hz), if the high-pass filter is enabled.

In one embodiment of the invention, changing an impedance loading value (e.g. 1 k-ohms, 3 k-ohms, 10 k-ohms, and etc.) also impacts the cutoff values for the high pass filter. For example, setting the variable impedance loading value to 1 k-ohms may have an effect on the high pass filter to make its cutoff value be somewhere around 300 Hz, if the high pass filter is turned on. Likewise, setting the variable impedance loading value to 10 k-ohms may have an effect on the high pass filter to make its cutoff value be somewhere around 40 Hz, if the high pass filter is turned on.

Figure 17:
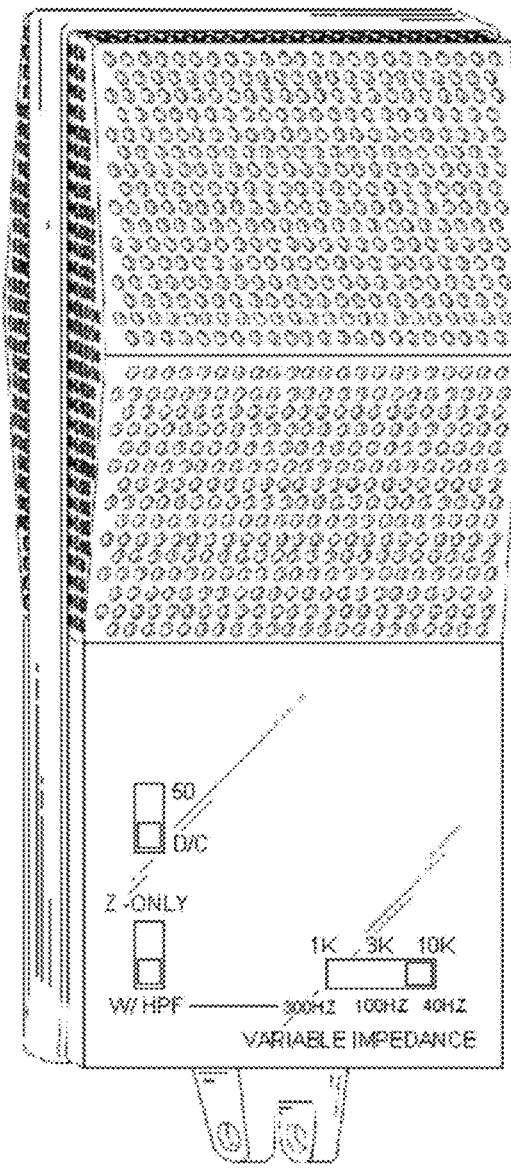
FIG. 17 shows several views of an active ribbon microphone casing which incorporates a phantom-powered inline preamplifier, a slider-based variable impedance loading adjustment interface, a high-pass filter adjustment interface, and a transformer impedance matching interface, in accordance with an embodiment of the invention.
Figure 17:
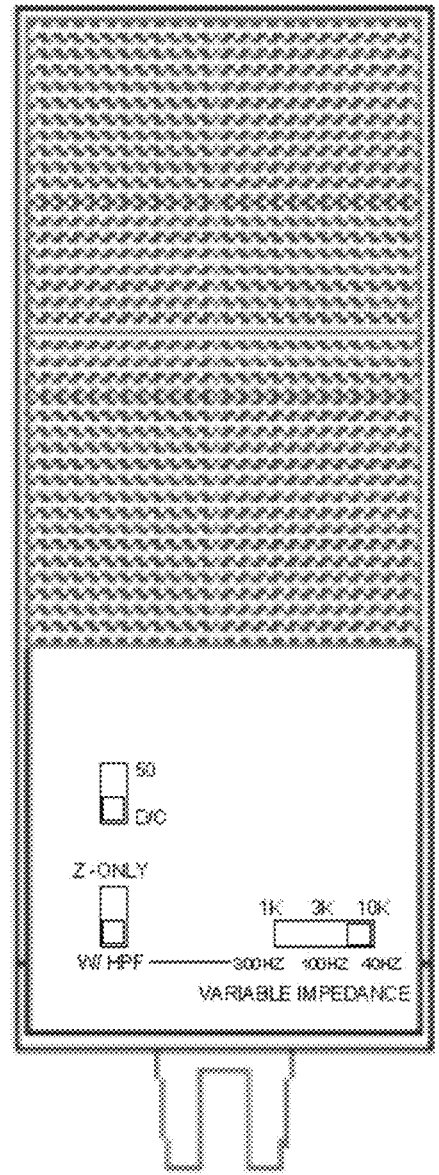

FIG. 17 shows several views (1700A, 1700B) of an active ribbon microphone casing which incorporates a phantom-powered inline preamplifier, a slider-based variable impedance loading adjustment interface, a high-pass filter adjustment interface, and an optional transformer impedance matching interface, in accordance with an embodiment of the invention. In this embodiment of the invention, variable impedance loading is related to resistive impedance-based variable loading effects, wherein one or more resistors and/or a potentiometer operatively connected to an adjustable interface (i.e. a slider) change resistive input impedance of the integrated phantom-powered inline preamplifier inside the active ribbon microphone casing. In a D/C mode, the transformer is bypassed and impedance is controlled resistively by the slider.

In this embodiment of the invention, the slider on a surface of the active ribbon microphone casing is configured to slide from a lowest impedance loading setting (i.e. 1 k-ohms) to a highest impedance loading setting (i.e. 10 k-ohms). The slider may be designed as a continuously-sliding interface, in which the variable impedance loading adjustment can be continuously swept from the lowest impedance loading setting to the highest impedance loading setting. In another embodiment of the invention, the slider may simply be set to several preset positions along the slider's path (e.g. 1 k-ohms, 3 k-ohms, 10 k-ohms, and etc.).

Furthermore, in the embodiment of the invention as shown in FIG. 17, a slider for variable high-pass filter on the surface of the active ribbon microphone casing is configured to slide to multiple positions (e.g. impedance (Z)-only mode, HPF enable mode (W/HPF), HPF adjustment for cutoff values of 40 Hz, 100 Hz, 300 Hz, and etc.) to adjust values of the variable high-pass filter. In this embodiment of the invention, the slider used as a high-pass filter adjustment interface on the active ribbon microphone with the integrated phantom-powered inline preamplifier may provide a bass-range reduction or cut (e.g. frequency reduction or cut below 40 Hz, 100 Hz, or 300 Hz), if the high-pass filter is enabled.

In one embodiment of the invention, changing an impedance loading value (e.g. 1 k-ohms, 3 k-ohms, 10 k-ohms, and etc.) also impacts the cutoff values for the high pass filter. For example, setting the variable impedance loading value to 1 k-ohms may have an effect on the high pass filter to make its cutoff value be somewhere around 300 Hz, if the high pass filter is turned on. Likewise, setting the variable impedance loading value to 10 k-ohms may have an effect on the high pass filter to make its cutoff value be somewhere around 40 Hz, if the high pass filter is turned on.

In addition, the active ribbon microphone casing as shown in FIG. 17 also has a transformer impedance matching interface with several modes of operation, including a direct-coupled (DC) mode, and a 50 ohm microphone mode. This provides the user a choice between a transformer-based impedance matching (50 ohm transformer impedance matching) and a direct coupling (DC) to the integrated inline phantom-powered preamplifier to allow resistive impedance matching. Providing this selectivity between the two modes may be useful because the sound characteristics are influenced by the transformer, which can be desirable in some applications. By having a D/C mode which enables resistive impedance adjustments using the variable impedance interface (i.e. instead of transformer-based impedance matching), various embodiments of the present invention, including an embodiment shown in FIG. 17, provides flexible impedance adjustment options.

Figure 18:
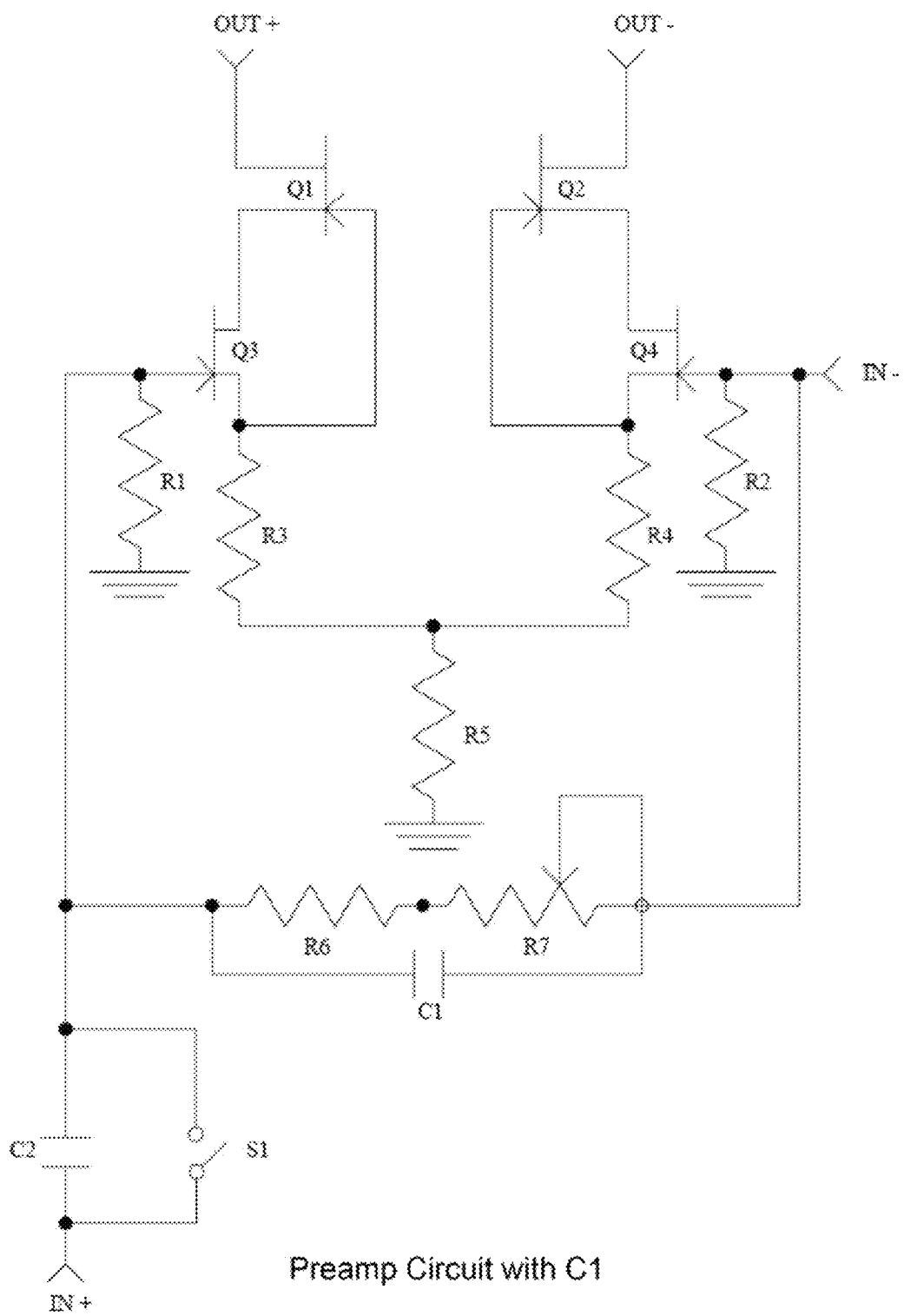
FIG. 18 shows an example of a circuit schematic for a phantom-powered inline preamplifier capable of variable impedance loading adjustment and high-pass filtering, in accordance with an embodiment of the invention.

FIG. 18 shows an example of a circuit schematic (1800) for a phantom-powered inline preamplifier capable of variable impedance loading adjustment and high-pass filtering, in accordance with an embodiment of the invention. This embodiment includes a phantom-powered preamplifier gain circuit unit. In this embodiment of the invention, the circuit schematic shows a phantom-powered inline preamplifier circuit with Q1 and Q2 transistors which are connected to output terminals (e.g. for loading phantom power and/or other components). Q3 and Q4 transistors are operatively connected to the input terminals and Q1 and Q2 transistors and provide a desirable amount of signal gain for the input signals to the input terminals. In a preferred embodiment of the invention, the circuit schematic (1800) further includes a resistor-capacitor (RC) network comprising resistors (R6, R7) and a capacitor (C1). This RC network enables the phantom-powered inline preamplifier circuit to be used as an external box powered by a +48V power supply in a microphone input device without radio frequency interference associated with a cable length. Furthermore, the capacitor (C1) acts as an RF shunt capacitor configured to suppress RF interferences when the wiring for a transformer-to-circuit input is long or poorly shielded by acting as an electrical dead short at radio frequencies.

The circuit schematic (1800) in FIG. 18 also includes a series capacitor (C2), a bypass switch (S1), and a potentiometer (R7) to the input circuitry. The capacitor (C2) acts as a high pass filter, which is bypassable via the switch (S1). The potentiometer (R7) varies the resistive impedance loading, which may also function as a variable high pass control when the capacitor is not bypassed, and also as a variable load to the microphone that allows the user to vary the microphone sound according to the characteristics of the microphone's output transformer.

Figure 19:
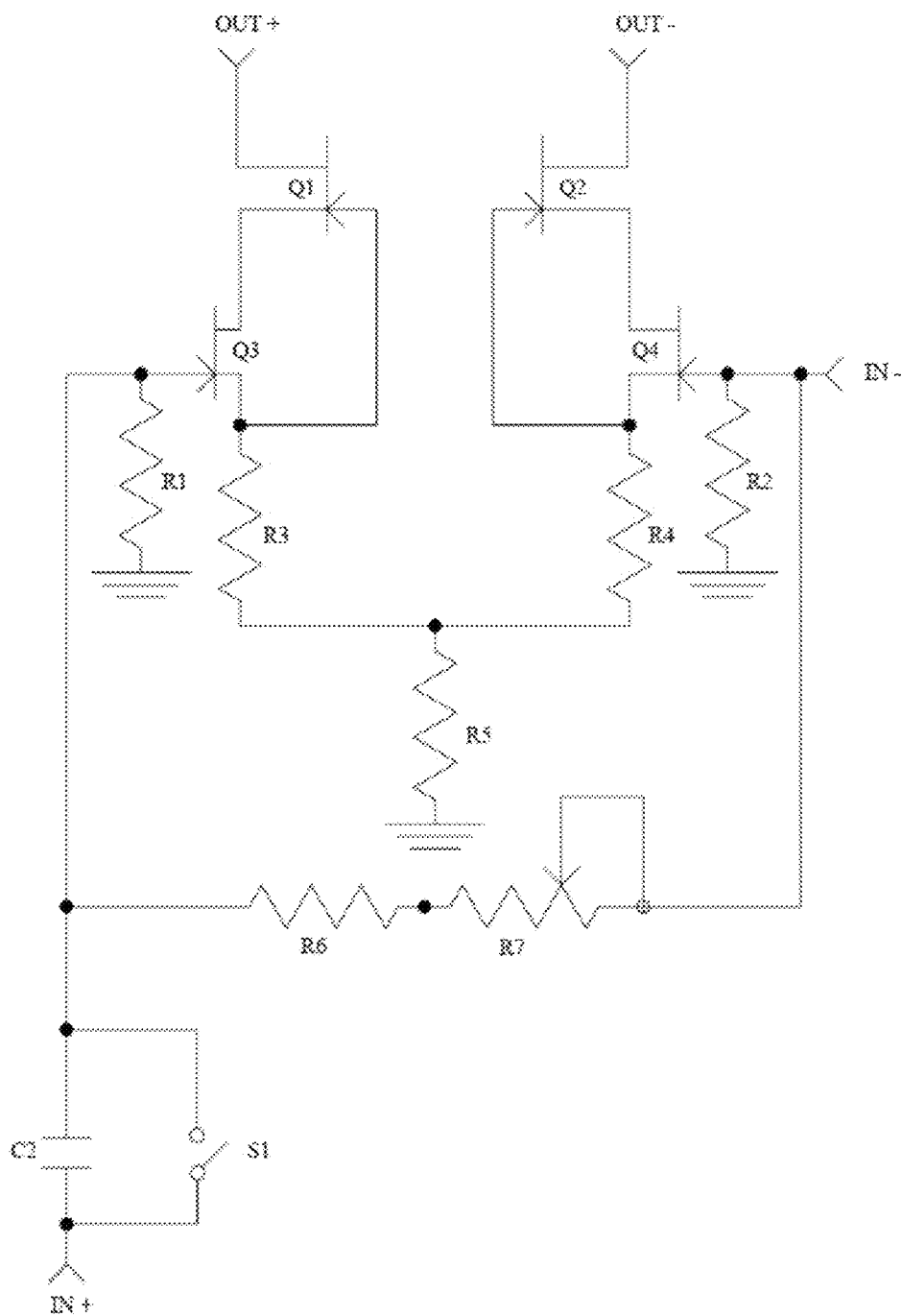
FIG. 19 shows an example of another circuit schematic for a phantom-powered inline preamplifier capable of variable impedance loading adjustment and high-pass filtering, in accordance with an embodiment of the invention.

FIG. 19 shows an example of another circuit schematic (1900) for a phantom-powered inline preamplifier capable of variable impedance loading adjustment and high-pass filtering, in accordance with an embodiment of the invention. This embodiment includes a phantom-powered preamplifier gain circuit unit. In this embodiment of the invention, the circuit schematic for the phantom-powered inline preamplifier is similar to FIG. 18 but does not include an RF shunt capacitor (C1) configured to suppress RF interferences.

Figure 20:
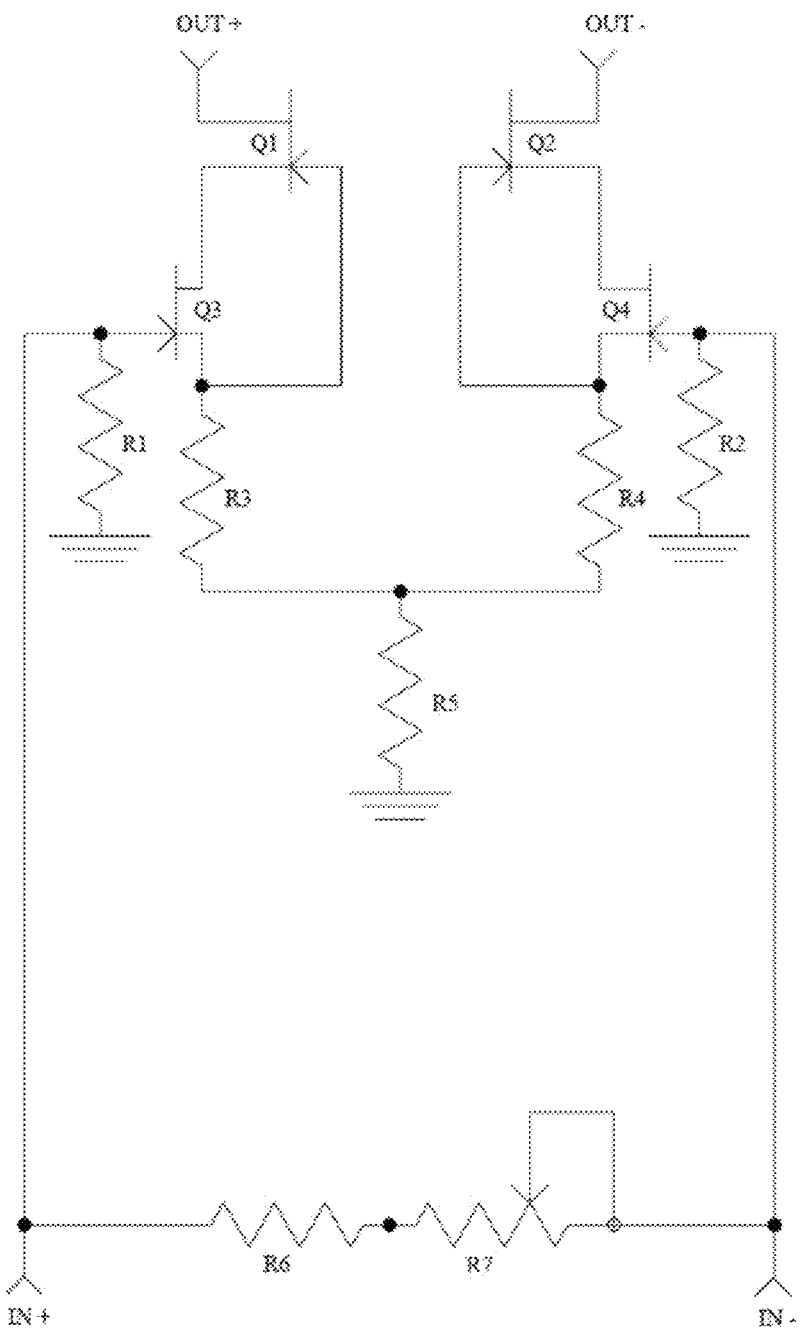
FIG. 20 shows an example of a circuit schematic for a phantom-powered inline preamplifier capable of variable impedance loading adjustment, in accordance with an embodiment of the invention.

FIG. 20 shows an example of another circuit schematic (2000) for a phantom-powered inline preamplifier capable of variable impedance loading adjustment, in accordance with an embodiment of the invention. This embodiment includes a phantom-powered preamplifier gain circuit unit. In this embodiment of the invention, the circuit schematic for the phantom-powered inline preamplifier is similar to FIG. 19 but does not include a high pass filter (e.g. C2, S1) operatively connected to an input terminal.

Figure 21:
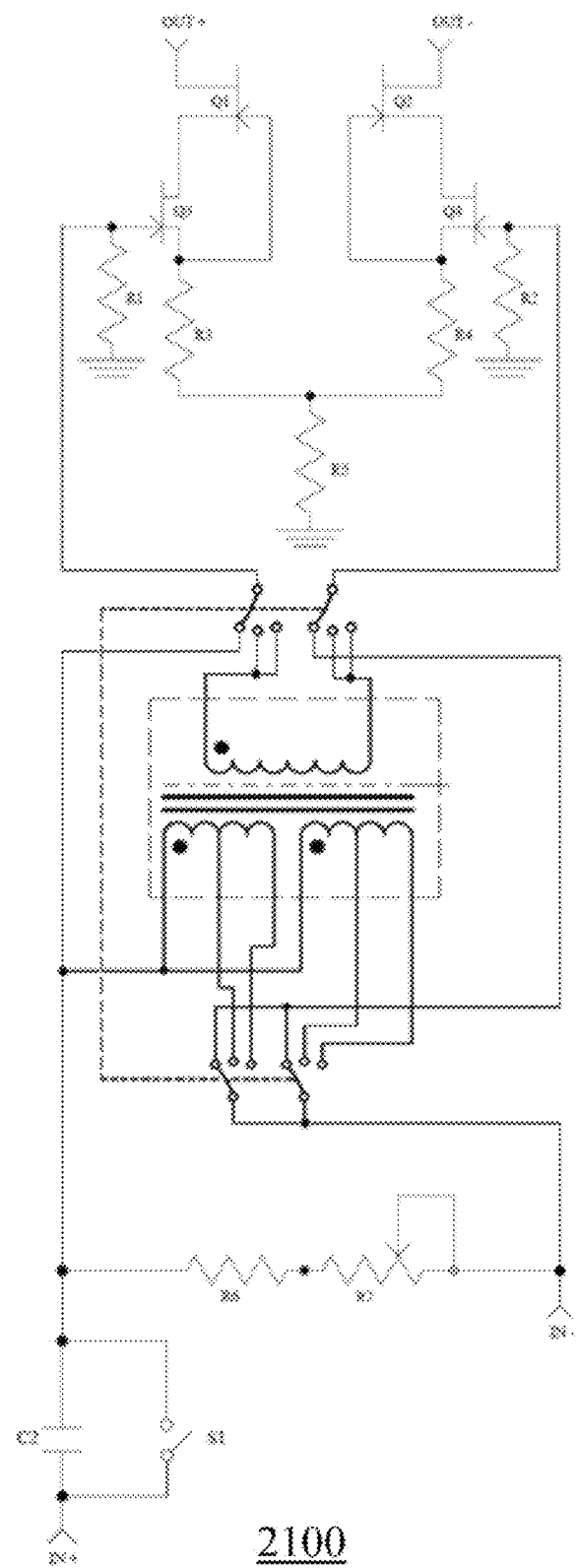
FIG. 21 shows an example of another circuit schematic for a phantom-powered inline preamplifier capable of variable impedance loading adjustment with a high-pass filter and a transformer (XFMR), in accordance with an embodiment of the invention.

FIG. 21 shows an example of another circuit schematic (2100) for a phantom-powered inline preamplifier capable of variable impedance loading adjustment with a high-pass filter and a transformer (XFMR), in accordance with an embodiment of the invention. This embodiment includes a phantom-powered preamplifier gain circuit unit. In this embodiment of the invention, the circuit schematic for the phantom-powered inline preamplifier is similar to FIG. 19 but additionally include a transformer (XFMR) operatively connected to input terminals, the high-pass filter, and the gates of Q3 and Q4 transistors.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A standalone phantom-powered inline preamplifier with variable impedance loading comprising:
a set of input terminals configured to receive a microphone electrical signal or another sound source signal, wherein the set of input terminals is operatively connected to a first set of one or more transistors inside the standalone phantom-powered inline preamplifier;
a set of output terminals configured to load phantom power and to simultaneously transmit an amplified signal from the microphone electrical signal or another sound source signal from the set of input terminals, wherein the set of output terminals is operatively connected to a second set of one or more transistors inside the standalone phantom-powered inline preamplifier;
a phantom-powered preamplifier gain circuit comprising the first set of one or more transistors, the second set of one or more transistors, and a resistor-capacitor network that includes a resistor and an RF shunt capacitor; and
a variable impedance loading adjustable interface that enables a user to select a particular impedance loading value among a plural selection of impedance loading values available on the variable impedance loading adjustable interface, wherein the user selecting the particular impedance loading value causes a user-specified adjustment of an input impedance and an internal impedance of the standalone phantom-powered inline preamplifier for user-desired sound characteristics achieved by varying impedance loading.

2. The standalone phantom-powered inline preamplifier of claim 1, wherein the variable impedance loading adjustable interface is operatively connected to one or more resistors and a potentiometer to change a resistive input impedance of the standalone phantom-powered inline preamplifier.

3. The standalone phantom-powered inline preamplifier of claim 1, wherein the variable impedance loading adjustable interface is a knob, a slider, a roller, or a switch that enables the user to select the particular impedance loading value among the plural selection of impedance loading values.

4. The standalone phantom-powered inline preamplifier of claim 1, wherein the plural selection of impedance loading values include 150 ohms, 1 kilo-ohms, 3 kilo-ohms, 10 kilo-ohms, and 15 kilo-ohms.

5. The standalone phantom-powered inline preamplifier of claim 1, wherein the plural selection of impedance loading values include 500 ohms, 3 kilo-ohms, and 10 kilo-ohms.

6. The standalone phantom-powered inline preamplifier of claim 1, further comprising an additional adjustable interface for variable high-pass filtering.

7. The standalone phantom-powered inline preamplifier of claim 1, further comprising an additional adjustable interface for variable transformer impedance matching.

8. The standalone phantom-powered inline preamplifier of claim 1, further comprising an additional adjustable interface for variable output gain setting.

9. The standalone phantom-powered inline preamplifier of claim 1, wherein the phantom power is supplied by a secondary preamplifier operatively connected to the standalone phantom-powered inline preamplifier, and wherein the phantom power is 48 DC Volts.

10. The standalone phantom-powered inline preamplifier of claim 3, wherein the knob, the slider, or the roller is a sweeping interface configured to be continuously swept from a lowest impedance loading setting to a highest impedance loading setting in the variable impedance loading adjustable interface.

11. An integrated phantom-powered inline preamplifier with variable impedance loading in an active microphone casing, the integrated phantom-powered inline preamplifier comprising:
a set of input terminals inside the active microphone casing, wherein the set of input terminals are configured to receive a microphone electrical signal from a passive circuitry within the active microphone casing, and wherein the set of input terminals is operatively connected to a first set of one or more transistors inside the integrated phantom-powered inline preamplifier;
a set of output terminals configured to load phantom power and to simultaneously transmit an amplified signal from the microphone electrical signal, wherein the set of output terminals is operatively connected to a second set of one or more transistors inside the integrated phantom-powered inline preamplifier;
a phantom-powered preamplifier gain circuit comprising the first set of one or more transistors, the second set of one or more transistors, and an resistor-capacitor network that includes a resistor and an RF shunt capacitor; and
a variable impedance loading adjustable interface that enables a user to select a particular impedance loading value among a plural selection of impedance loading values available on the variable impedance loading adjustable interface, wherein the user selecting the particular impedance loading value causes a user-specified adjustment of an input impedance and an internal impedance of the integrated phantom-powered inline preamplifier for user-desired sound characteristics achieved by varying impedance loading.

12. The integrated phantom-powered inline preamplifier of claim 11, wherein the variable impedance loading adjustable interface is operatively connected to one or more resistors and a potentiometer to change a resistive input impedance of the integrated phantom-powered inline preamplifier.

13. The integrated phantom-powered inline preamplifier of claim 11, wherein the variable impedance loading adjustable interface is a knob, a slider, a roller, or a switch that enables the user to select the particular impedance loading value among the plural selection of impedance loading values.

14. The integrated phantom-powered inline preamplifier of claim 11, wherein the plural selection of impedance loading values include 150 ohms, 1 kilo-ohms, 3 kilo-ohms, 10 kilo-ohms, and 15 kilo-ohms.

15. The integrated phantom-powered inline preamplifier of claim 11, wherein the plural selection of impedance loading values include 500 ohms, 3 kilo-ohms, and 10 kilo-ohms.

16. The integrated phantom-powered inline preamplifier of claim 11, further comprising an additional adjustable interface for variable high-pass filtering.

17. The integrated phantom-powered inline preamplifier of claim 11, further comprising an additional adjustable interface for variable transformer impedance matching.

18. The integrated phantom-powered inline preamplifier of claim 11, further comprising an additional adjustable interface for variable output gain setting.

19. The integrated phantom-powered inline preamplifier of claim 11, wherein the phantom power is supplied by a secondary preamplifier operatively connected to the integrated phantom-powered inline preamplifier, and wherein the phantom power is 48 DC Volts.

20. The integrated phantom-powered inline preamplifier of claim 13, wherein the knob, the slider, or the roller is a sweeping interface configured to be continuously swept from a lowest impedance loading setting to a highest impedance loading setting in the variable impedance loading adjustable interface.

* * * * *